(12) United States Patent
Kaneda et al.

(10) Patent No.: US 6,838,321 B2
(45) Date of Patent: Jan. 4, 2005

(54) SEMICONDUCTOR SUBSTRATE WITH DEFECTS REDUCED OR REMOVED AND METHOD OF MANUFACTURING THE SAME, AND SEMICONDUCTOR DEVICE CAPABLE OF BIDIRECTIONALLY RETAINING BREAKDOWN VOLTAGE AND METHOD OF MANUFACTURING THE SAME

(75) Inventors: Mitsuru Kaneda, Tokyo (JP); Hideki Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/670,331

(22) Filed: Sep. 26, 2003

(65) Prior Publication Data

US 2004/0061134 A1 Apr. 1, 2004

Related U.S. Application Data

(63) Continuation-in-part of application No. 10/366,520, filed on Feb. 14, 2003, now abandoned.

(30) Foreign Application Priority Data

Sep. 26, 2002 (JP) ...................................... 2002-280666
Jul. 9, 2003 (JP) ...................................... 2003-194129

(51) Int. Cl.[7] ........................ H01L 21/332; H01L 29/74
(52) U.S. Cl. ....................... 438/133; 438/135; 438/143; 438/151; 438/310; 438/407; 438/471; 438/543; 438/514; 257/119; 257/124; 257/133; 257/138; 257/153; 257/337
(58) Field of Search ................................ 438/133, 135, 438/143, 151, 160, 170, 310, 402, 407, 471, 520, 528, 543, 510, 514; 257/119, 124, 133, 138, 153, 337; 148/DIG. 24

(56) References Cited

U.S. PATENT DOCUMENTS 3,856,586 A * 12/1974 Borchert et al. ............ 438/133
5,272,119 A * 12/1993 Falster ........................ 438/58
5,539,245 A * 7/1996 Imura et al. ................ 257/610

(List continued on next page.)

OTHER PUBLICATIONS

Japanese Patent Application Laid–Open No. 2002–76017 (2002) including an English translation of an extract.

M. Takei, Y. Harada and K. Ueno, "600V–IGBT with Reverse Blocking Capability", p. 413, Proceedings of 2001 International Symposium on Power Semiconductor Devices & Ics, Osaka.

Primary Examiner—Matthew Smith
Assistant Examiner—Belur Keshavan
(74) Attorney, Agent, or Firm—Oblon, Spivak, McClelland, Maier & Neustadt, P.C.

(57) ABSTRACT

An $N^-$-type silicon substrate (1) has a bottom surface and an upper surface which are opposed to each other. In the bottom surface of the $N^-$-type silicon substrate (1), a P-type impurity diffusion layer (3) of high concentration is entirely formed by diffusing a P-type impurity. In the upper surface of the $N^-$-type silicon substrate (1), a P-type isolation region (2) is partially formed by diffusing a P-type impurity. The P-type isolation region (2) has a bottom surface reaching an upper surface of the P-type impurity diffusion layer (3). As viewed from the upper surface side of the $N^-$-type silicon substrate (1), the P-type isolation region (2) is formed, surrounding an $N^-$ region (1a) which is part of the $N^-$-type silicon substrate (1). The $N^-$ region (1a) surrounded by the P-type isolation region (2) is defined as an element formation region of the $N^-$-type silicon substrate (1). Thus obtained are a semiconductor device and a method of manufacturing the same, and a semiconductor substrate and a method of manufacturing the same, which make it possible to retain bidirectional breakdown voltages and ensure high reliability.

26 Claims, 23 Drawing Sheets

U.S. PATENT DOCUMENTS

| | | | | |
|---|---|---|---|---|
| 5,900,652 A | * | 5/1999 | Battaglia et al. | 257/135 |
| 5,977,569 A | * | 11/1999 | Li | 257/119 |
| 6,168,981 B1 | * | 1/2001 | Battaglia et al. | 438/164 |
| 6,229,196 B1 | * | 5/2001 | Shishido et al. | 257/617 |
| 6,326,648 B1 | * | 12/2001 | Jalade et al. | 257/130 |
| 6,580,100 B2 | * | 6/2003 | Mathieu | 257/124 |
| 2002/0048915 A1 | * | 4/2002 | Reznik | 438/565 |
| 2003/0057522 A1 | * | 3/2003 | Francis et al. | 257/566 |
| 2004/0061134 A1 | * | 4/2004 | Kaneda et al. | 257/199 |

* cited by examiner

F I G . 2 4
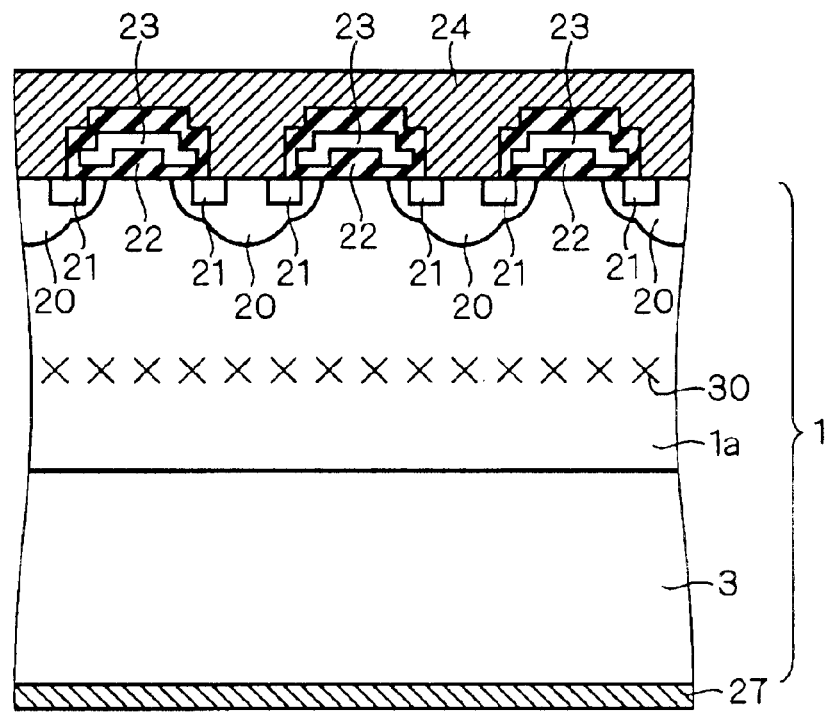
F I G . 2 5
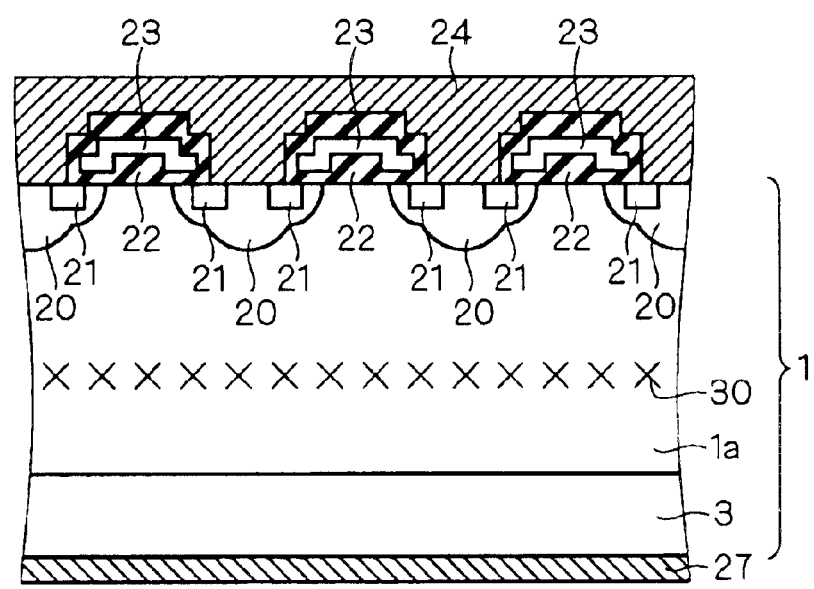

SEMICONDUCTOR SUBSTRATE WITH DEFECTS REDUCED OR REMOVED AND METHOD OF MANUFACTURING THE SAME, AND SEMICONDUCTOR DEVICE CAPABLE OF BIDIRECTIONALLY RETAINING BREAKDOWN VOLTAGE AND METHOD OF MANUFACTURING THE SAME

BACKGROUND OF THE INVENTION

1. Field of the Invention

The present invention relates to a semiconductor substrate used in a power semiconductor device and a method of manufacturing the same, and a semiconductor device using the semiconductor substrate and a method of manufacturing the same.

2. Description of the Background Art

In recent, a power circuit called an AC matrix converter in which direct switching of a three-phase voltage source is performed by a bidirectional switch has been proposed. As the bidirectional switch used in the AC matrix converter, a power device having bidirectional breakdown voltages is required. As an example of this, an IGBT capable of bidirectionally retaining its breakdown voltages is disclosed in M. Takei, Y. Harada, and K. Ueno, "600V-IGBT with Reverse Blocking Capability", Proceedings of 2001 International Symposium on Power Semiconductor Devices & ICs, Osaka.

Also, a technique for forming a local lifetime region by helium irradiation or proton irradiation is disclosed in Japanese Patent Application Laid-Open No. 2002-76017.

In the IGBT described in Takei et al., however, by providing a trench of mesa structure from a surface of a substrate to a collector P layer and forming a substance to relieve an electric field inside the trench, the breakdown voltage is retained. Though this method is adopted in an existing triac and the like, it has a problem of low reliability.

In addition, in the above-mentioned Japanese Patent Application Laid-Open No. 2002-76017, helium and proton are treated alike, but, depending on the implantation depth of proton into the substrate, a problem arises that reverse breakdown voltage reduces because the implanted protons are made to act as a donor.

SUMMARY OF THE INVENTION

It is an object of the present invention to provide a highly-reliable semiconductor device capable of bidirectionally retaining breakdown voltages and a method of manufacturing the same, and provide a semiconductor substrate used for the semiconductor device and a method of manufacturing the same.

A first aspect of the present invention is intended for a semiconductor substrate, and according to the first aspect, the semiconductor substrate includes a substrate, an impurity diffusion layer and an impurity diffusion region. The substrate of a first conductivity type has a first main surface and a second main surface which are opposed to each other. The impurity diffusion layer of a second conductivity type different from the first conductivity type is formed in the first main surface by diffusing an impurity. The impurity diffusion region of the second conductivity type is formed partially in the second main surface by diffusing an impurity, having a bottom surface reaching the impurity diffusion layer and surrounding a portion of the substrate which has the first conductivity type in a plan view. The portion surrounded by the impurity diffusion region is defined as an element formation region.

The semiconductor substrate is manufactured by forming the impurity diffusion layer in the first main surface of the substrate and then forming the impurity diffusion region in the second main surface of the substrate. At this time, since the impurity diffusion layer serves as a gettering site against a damage caused by formation of the impurity diffusion region, it is possible to reduce or remove a defect of the semiconductor substrate caused by formation of the impurity diffusion region.

A second aspect of the present invention is intended for a semiconductor device, and according to the second aspect, the semiconductor device includes a semiconductor substrate and a first impurity region. The semiconductor substrate includes a substrate, an impurity diffusion layer and an impurity diffusion region. The substrate of a first conductivity type has a first main surface and a second main surface which are opposed to each other. The impurity diffusion layer of a second conductivity type different from the first conductivity type is formed in the first main surface by diffusing an impurity. The impurity diffusion region of the second conductivity type is formed partially in the second main surface by diffusing an impurity, having a bottom surface reaching the impurity diffusion layer and surrounding a portion of the substrate which has the first conductivity type in a plan view. The portion surrounded by the impurity diffusion region is defined as an element formation region. The first impurity region of the second conductivity type is formed partially in the second main surface in the element formation region.

With extension of a depletion layer from the first impurity region, a forward breakdown voltage can be retained. Further, with extension of a depletion layer from the impurity diffusion layer and the impurity diffusion region, a reverse breakdown voltage can be retained. In short, it is possible to retain both the forward breakdown voltage and the reverse breakdown voltage.

A third aspect of the present invention is intended for a semiconductor device, and according to the third aspect, the semiconductor device includes a semiconductor substrate, a first impurity region, a second impurity region, a gate electrode, and a first local lifetime region. The semiconductor substrate includes a substrate, an impurity diffusion layer, and an impurity diffusion region. The substrate of a first conductivity type has a first main surface and a second main surface which are opposed to each other. The impurity diffusion of a second conductivity type that is different from the first conductivity type is formed in the first main surface, and serves as a collector of a transistor. The impurity diffusion region of the second conductivity type is formed partially in the second main surface, has a bottom surface reaching the impurity diffusion layer, and surrounds a portion of the substrate which has the first conductivity type in a plan view. The portion surrounded by the impurity diffusion region is defined as an element formation region. The first impurity region of the second conductivity type is formed partially in the second main surface in the element formation region and serves as a base of the transistor. The second impurity region of the first conductivity type is formed partially in the second main surface in the first impurity region and serving as an emitter of the transistor. The gate electrode is formed on the second main surface with a gate insulating film interposed therebetween above the first impurity region positioned between the second impurity region and a portion of the substrate which has the first conductivity type. The first local lifetime region is formed by implanting protons into a substantially middle region, with respect to a film thickness direction, of the portion of the substrate which has the first conductivity type.

Both the forward breakdown voltage and the reverse breakdown voltage can be retained at high level.

A fourth aspect of the present invention is intended for a method of manufacturing a semiconductor substrate, and according to the fourth aspect, the method includes the steps (a) to (c). The step (a) is to prepare a substrate of a first conductivity type, having a first main surface and a second main surface which are opposed to each other. The step (b) is to form an impurity diffusion layer of a second conductivity type different from the first conductivity type by diffusing a first impurity into the substrate from the first main surface. The step (c) is to form an impurity diffusion region of the second conductivity type by diffusing a second impurity into the substrate from part of the second main surface, to have a bottom surface reaching the impurity diffusion layer and surround a portion of the substrate which has the first conductivity type in a plan view. The portion surrounded by the impurity diffusion region is defined as an element formation region.

Since the impurity diffusion layer serves as a gettering site against a damage caused by formation of the impurity diffusion region, it is possible to reduce or remove a defect of the substrate caused by formation of the impurity diffusion region.

A fifth aspect of the present invention is intended for a method of manufacturing a semiconductor device, and according to the fifth aspect, the method includes the steps (a) to (f). The step (a) is to prepare a substrate of a first conductivity type, having a first main surface and a second main surface which are opposed to each other. The step (b) is to form an impurity diffusion layer of a second conductivity type different from the first conductivity type by diffusing a first impurity into the substrate from the first main surface. The step (c) is to form an impurity diffusion region of the second conductivity type by diffusing a second impurity into the substrate from part of the second main surface, to have a bottom surface reaching the impurity diffusion layer and surround a portion of the substrate which has the first conductivity type in a plan view. The portion surrounded by the impurity diffusion region is defined as an element formation region. The step (d) is to form a first impurity region of the second conductivity type partially in the second main surface in the element formation region. The step (e) is to form a second impurity region of the first conductivity type partially in the second main surface in the first impurity region. The step (f) is to form a gate electrode on the second main surface with a gate insulating film interposed therebetween above the first impurity region positioned between the second impurity region and a portion of the substrate which has the first conductivity type. The first impurity region serves as a base of a transistor, the second impurity region serves as an emitter of the transistor, and the impurity diffusion layer serves as a collector of the transistor.

With extension of a depletion layer from the first impurity region, a forward breakdown voltage can be retained. Further, with extension of a depletion layer from the impurity diffusion layer and the impurity diffusion region, a reverse breakdown voltage can be retained. In short, it is possible to obtain an IGBT in which both the forward breakdown voltage and the reverse breakdown voltage can be retained.

A sixth aspect of the present invention is intended for a method of manufacturing a semiconductor device, and according to the sixth aspect, the method includes the steps (a) to (g). The step (a) is to prepare a substrate of a first conductivity type, having a first main surface and a second main surface which are opposed to each other. The step (b) is to form, in the first main surface, an impurity diffusion layer of a second conductivity type different from the first conductivity type, the impurity diffusion layer serving as a collector of a transistor. The step (c) is to form, partially in the second main surface, an impurity diffusion region of the second conductivity type having a bottom surface reaching the impurity diffusion layer and surrounding a portion of the substrate which has the first conductivity type in a plan view. The portion surrounded by the impurity diffusion region is defined as an element formation region. The step (d) is to form, partially in the second main surface in the element formation region, a first impurity region of the second conductivity type serving as a base of the transistor. The step (e) is to form, partially in the second main surface in the first impurity region, a second impurity region of the first conductivity type serving as an emitter of the transistor. The step (f) is to form a gate electrode on the second main surface with a gate insulating film interposed therebetween above the first impurity region positioned between the second impurity region and a portion of the substrate which has the first conductivity type. The step (g) is to form a first local lifetime region by implanting proton into a substantially middle region, with respect to a film thickness direction, of the portion of the substrate which has the first conductivity type, from the side of the first main surface through the impurity diffusion layer.

Both the forward breakdown voltage and the reverse breakdown voltage can be retained at high level.

These and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a cross section showing a structure of a semiconductor device in accordance with a fourth preferred embodiment of the present invention;

FIG. 25 is a cross section showing a structure of a semiconductor device in accordance with a fifth preferred embodiment of the present invention;

DESCRIPTION OF THE PREFERRED EMBODIMENTS

First Preferred Embodiment

Figure 1:
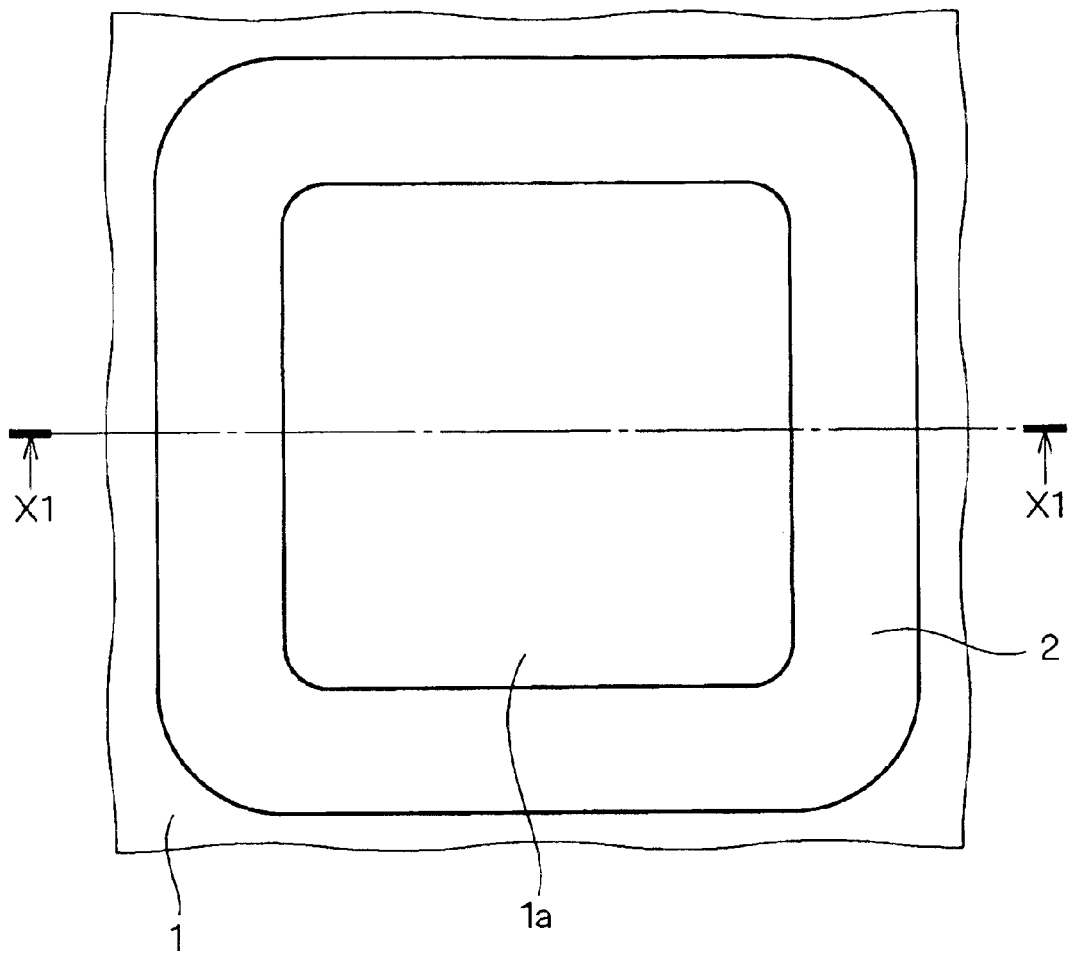
FIG. 1 is a plan view showing a structure of a semiconductor substrate in accordance with a first preferred embodiment of the present invention.
Figure 2:
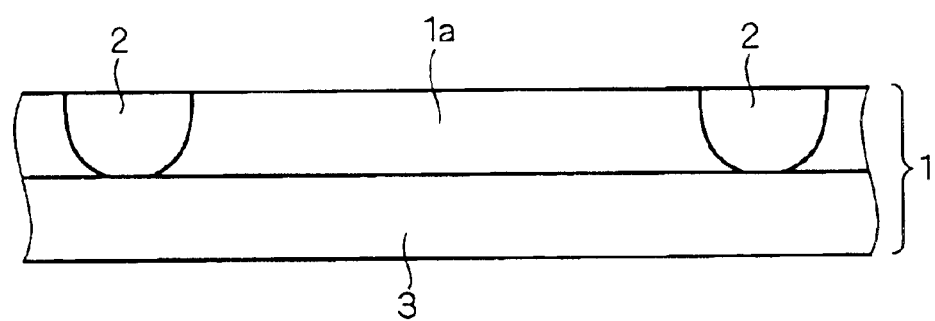
FIG. 2 is a cross section showing a cross-sectional structure with respect to a position along the line X1—X1 of FIG. 1.

FIG. 1 is a plan view showing a structure of a semiconductor substrate in accordance with a first preferred embodiment of the present invention, and FIG. 2 is a cross section showing a cross-sectional structure with respect to a position along the line X1—X1 of FIG. 1. Referring to FIG. 2, an N⁻-type silicon substrate 1 has a bottom surface and an upper surface which are opposed to each other. In the bottom surface of the N⁻-type silicon substrate 1, a P-type impurity diffusion layer 3 of high concentration is entirely formed by diffusing a P-type impurity. In the upper surface of the N⁻-type silicon substrate 1, a P-type isolation region 2 is partially formed by diffusing a P-type impurity. The P-type isolation region 2 has a bottom surface which reaches an upper surface of the P-type impurity diffusion layer 3. Further, referring to FIG. 1, as viewed from the upper surface side of the N⁻-type silicon substrate 1, the P-type isolation region 2 is formed, surrounding an N⁻ region 1a which is part of the N⁻-type silicon substrate 1. The N⁻ region 1a surrounded by the P-type isolation region 2 is defined as an element formation region of the N⁻-type silicon substrate 1.

Figure 3:
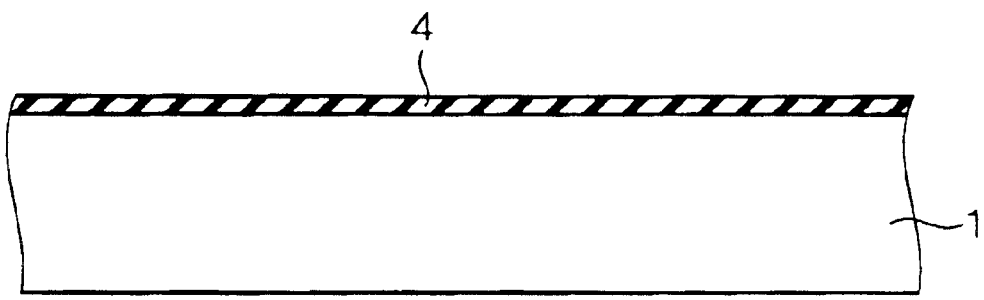
FIGS. 3 to 6 are cross sections showing a method of manufacturing the semiconductor substrate in accordance with the first preferred embodiment of the present invention step by step.

FIGS. 3 to 6 are cross sections showing a method of manufacturing the semiconductor substrate in accordance with the first preferred embodiment of the present invention step by step. Referring to FIG. 3, first, the N⁻-type silicon substrate 1 is prepared. Next, a silicon oxide film 4 is formed by thermal oxidation entirely on the upper surface of the N⁻-type silicon substrate 1.

Figure 4:
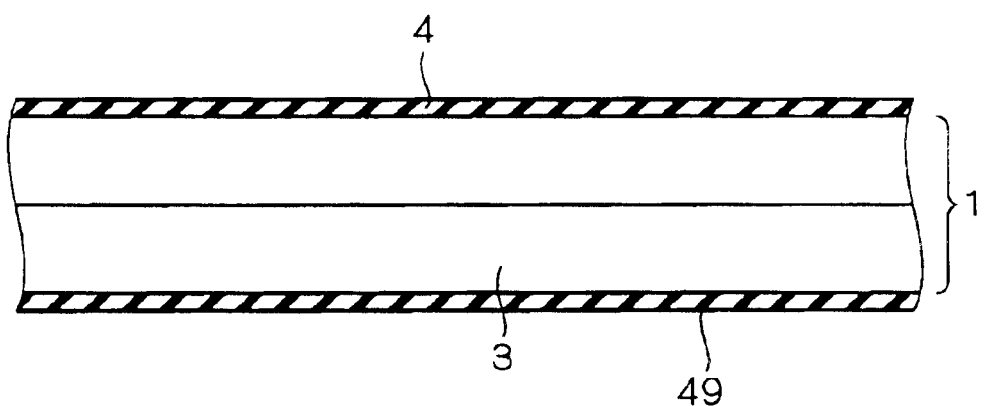

Referring to FIG. 4, next, a substance (e.g., an insulating film) 49 containing a P-type impurity such as boron is entirely coated on the bottom surface of the N⁻-type silicon substrate 1. After that, a heat treatment is performed to introduce and thermally diffuse the P-type impurity contained in the substance 49 into the N⁻-type silicon substrate 1. With this introduction and thermal diffusion, the P-type impurity diffusion layer 3 is formed in the bottom surface of the N⁻-type silicon substrate 1. After that, the silicon oxide film 4 and the substance 49 are removed. By controlling the temperature and time of the heat treatment in thermally diffusing the P-type impurity, it is possible to arbitrarily determine the depth of the P-type impurity diffusion layer 3 from the bottom surface of the N⁻-type silicon substrate 1.

Figure 5:
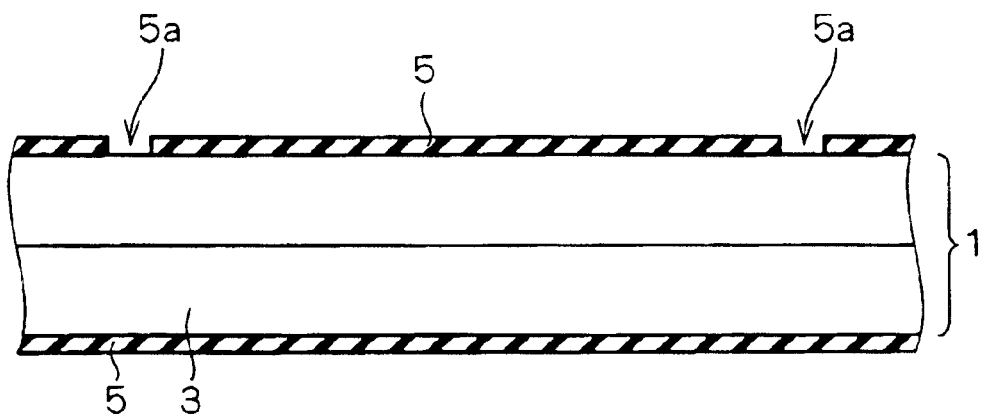

Referring to FIG. 5, next, a silicon oxide film 5 is formed entirely on the upper surface and the bottom surface of the N⁻-type silicon substrate 1 by thermal oxidation. Subsequently, the silicon oxide film 5 formed on the upper surface of the N⁻-type silicon substrate 1 is partially removed by photolithography and etching. This produces an opening 5a to expose part of the upper surface of the N⁻-type silicon substrate 1.

Figure 6:
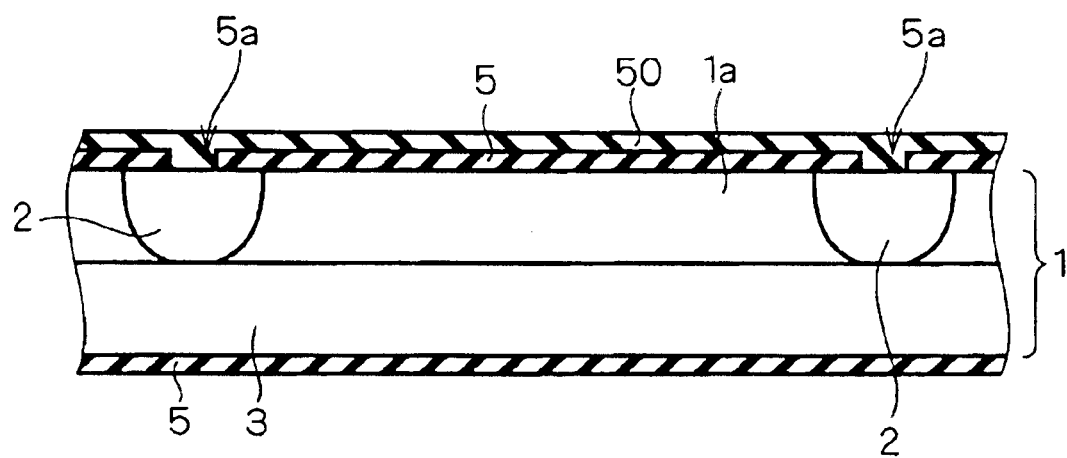

Referring to FIG. 6, next, a substance (e.g., an insulating film) 50 containing a P-type impurity such as boron is coated on the upper surface of the N⁻-type silicon substrate 1, covering the silicon oxide film 5. At a portion where the opening 5a is formed, the insulating film 50 comes into contact with the upper surface of the N⁻-type silicon substrate 1. After that, a heat treatment is performed to introduce and thermally diffuse the P-type impurity contained in the substance 50 into the N⁻-type silicon substrate 1 at the portion where the substance 50 and the N⁻-type silicon substrate 1 are in contact with each other. With this introduction and thermal diffusion, the P-type isolation region 2 is formed in the upper surface of the N⁻-type silicon substrate 1. After that, the silicon oxide film 5 and the substance 50 are removed, and the semiconductor substrate of FIG. 2 is thereby obtained.

Thus, in the semiconductor substrate and the method of manufacturing the same of the first preferred embodiment, the P-type isolation region 2 is formed in the upper surface of the N⁻-type silicon substrate 1 after forming the P-type impurity diffusion layer 3 of high concentration in the bottom surface of the N⁻-type silicon substrate 1. Therefore, since the P-type impurity diffusion layer 3 serves as a gettering site against the damage in forming the P-type isolation region 2, it is possible to obtain a semiconductor substrate in which the defect caused by formation of the P-type isolation region 2 is reduced or removed.

Figure 7:
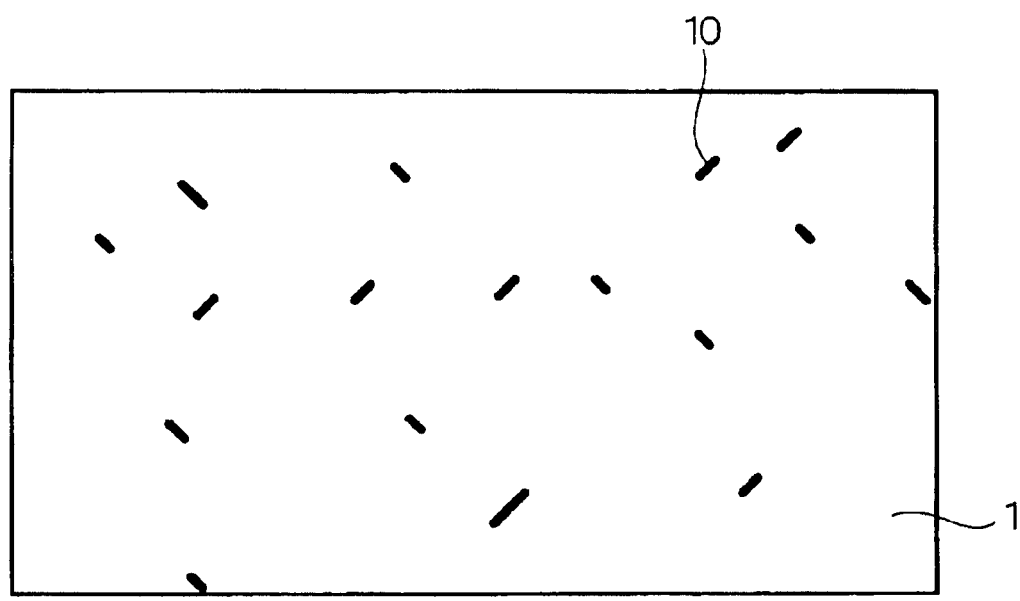
FIGS. 7 and 8 are views showing an effect of the semiconductor substrate and the method of manufacturing the same in the first preferred embodiment.
Figure 8:
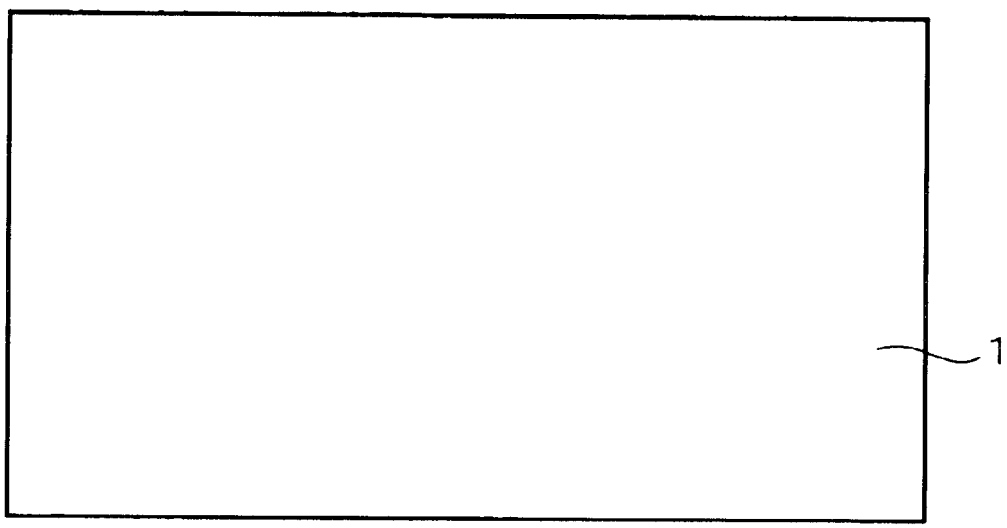

Specific verification of this effect will be made below. FIGS. 7 and 8 are views showing an effect of the semiconductor substrate and the method of manufacturing the same in the first preferred embodiment. FIG. 7 shows an exemplary case where the P-type isolation region 2 is formed without forming the P-type impurity diffusion layer 3, and FIG. 8 shows an exemplary case where the P-type isolation region 2 is formed after forming the P-type impurity diffusion layer 3.

In an upper surface of a FZ wafer having a film thickness of 800 μm, the P-type isolation region 2 is formed to have a depth of about 250 μm. Next, a heat treatment is performed at 1100° C. or over for about 60 minutes. Next, after cleaving the wafer, etching is performed by using Sirtl etchant to elicit defects. FIG. 7 shows an observation result with a microscope, of the sample which is thus obtained. As shown in FIG. 7, there are many defects 10 which are seemed to be OSFs (Oxide Stacking Faults) in the wafer. When an IGBT is manufactured using this wafer, a leakage current in measuring the breakdown voltage is too large and particularly it becomes much larger at high temperature (125° C.), and therefore the IGBT can not operate normally.

On the other hand, FIG. 8 shows an observation result of a sample obtained by forming the P-type impurity diffusion layer 3 in the bottom surface of the FZ wafer and then forming the P-type isolation region 2 to have a depth of about 180 $\mu$m. As shown in FIG. 8, there is no defect 10 in the wafer. When an IGBT is manufactured using this wafer, the leakage current in measuring the breakdown voltage is markedly reduced as compared with the case where no P-type impurity diffusion layer 3 is formed.

Second Preferred Embodiment

Figure 9:
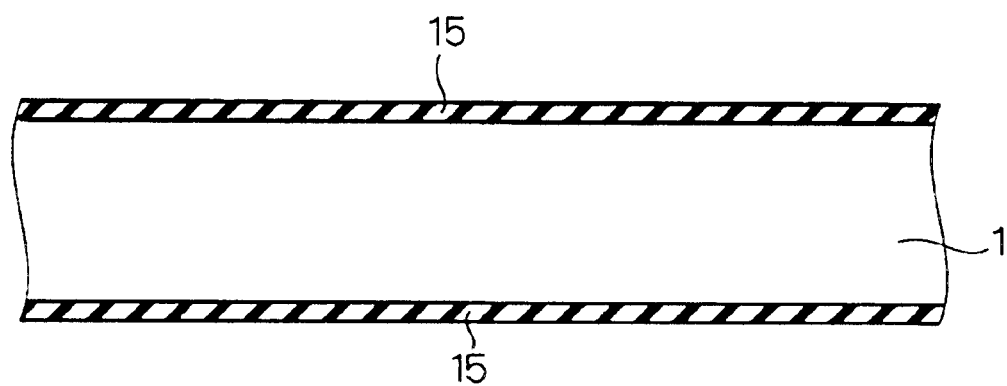
FIGS. 9 to 11 are cross sections showing a method of manufacturing a semiconductor substrate in accordance with a second preferred embodiment of the present invention step by step.
Figure 10:
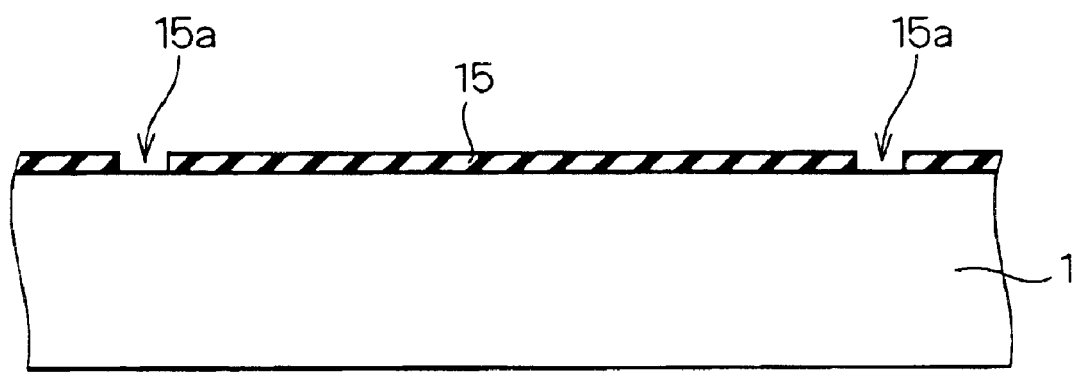
Figure 11:
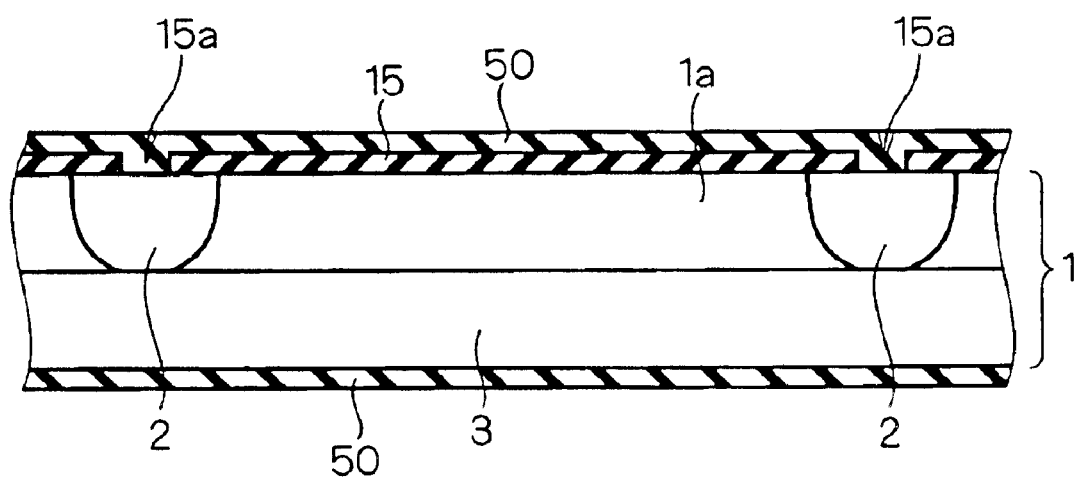

FIGS. 9 to 11 are cross sections showing a method of manufacturing a semiconductor substrate in accordance with a second preferred embodiment of the present invention step by step. Referring to FIG. 9, first, the N$^-$-type silicon substrate 1 is prepared. Next, a silicon oxide film 15 is formed by thermal oxidation entirely on the upper surface and the bottom surface of the N$^-$-type silicon substrate 1.

Referring to FIG. 10, next, the silicon oxide film 15 formed on the upper surface of the N$^-$-type silicon substrate 1 is partially removed by photolithography and etching. This produces an opening 15a to expose part of the upper surface of the N$^-$-type silicon substrate 1. Further, the silicon oxide film 15 formed on the bottom surface of the N$^-$-type silicon substrate 1 is entirely removed by etching. This exposes the bottom surface of the N$^-$-type silicon substrate 1.

Referring to FIG. 11, next, the substance 50 containing a P-type impurity such as boron is formed by CVD on the upper surface of the N$^-$-type silicon substrate 1, covering the silicon oxide film 15 and on the bottom surface of the N$^-$-type silicon substrate 1. After that, a heat treatment is performed to introduce and thermally diffuse the P-type impurity contained in the substance 50 into the N$^-$-type silicon substrate 1 at the portion where the substance 50 and the N$^-$-type silicon substrate 1 are in contact with each other. With this introduction and thermal diffusion, the P-type isolation region 2 is formed in the upper surface of the N$^-$-type silicon substrate 1 and the P-type impurity diffusion layer 3 is formed in the bottom surface of the N$^-$-type silicon substrate 1. After that, the silicon oxide film 15 and the substance 50 are removed, and the semiconductor substrate of FIG. 2 is thereby obtained.

Figure 12:
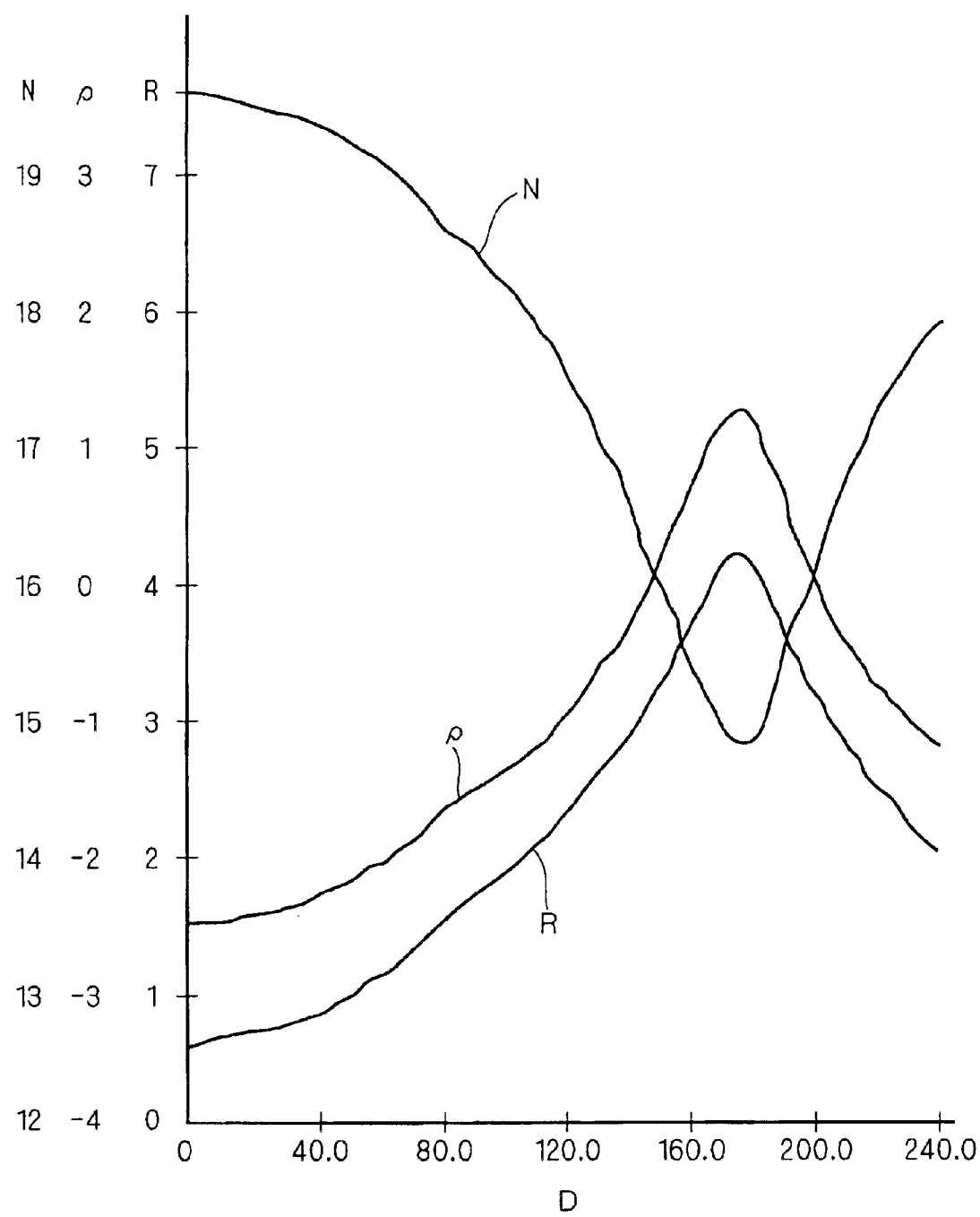
FIG. 12 is a graph showing a result of SR evaluation on the semiconductor substrate manufactured by the method in accordance with the second preferred embodiment.

FIG. 12 is a graph showing a result of SR (Spreading Resistance) evaluation on the semiconductor substrate manufactured by the method in accordance with the second preferred embodiment. The horizontal axis indicates the depth D ($\mu$m) from the upper surface of the N$^-$-type silicon substrate 1 and the vertical axis indicates the concentration N (cm$^{-3}$), the resistivity $\rho$ ($\Omega$·cm) and the resistance R ($\Omega$). FIG. 12 shows the result of the SR evaluation, extracting an area from the upper surface of the N$^-$-type silicon substrate 1 to the depth of 240 $\mu$m out of the semiconductor substrate having a film thickness of 350 $\mu$m.

It can be seen from FIG. 12 that the characteristics, i.e., the concentration N, the resistivity $\rho$ and the resistance R, are each almost symmetrical with respect to the depth near the center of the film thickness of the semiconductor substrate (175 $\mu$m). In other words, it is found that the thickness of the P-type impurity diffusion layer 3 is almost equal to the depth of the P-type isolation region 2 from the upper surface of the N$^-$-type silicon substrate 1 (both are 175 $\mu$m) in the semiconductor substrate of the second preferred embodiment. With attention given to the characteristic of concentration N, the impurity concentration distribution of the P-type impurity diffusion layer 3 from the bottom surface of the N$^-$-type silicon substrate 1 towards the inside of the substrate is almost equal to that of the P-type isolation region 2 from the upper surface of the N$^-$-type silicon substrate 1 towards the inside of the substrate.

Thus, in the semiconductor substrate and the method of manufacturing the same according to the second preferred embodiment, the thermal diffusion of P-type impurity for forming the P-type isolation region 2 and that for forming the P-type impurity diffusion layer 3 are performed in the same process as shown in FIG. 11. As a result, it is possible to reduce the number of manufacturing process steps as compared with the above-discussed first preferred embodiment.

Figure 13:
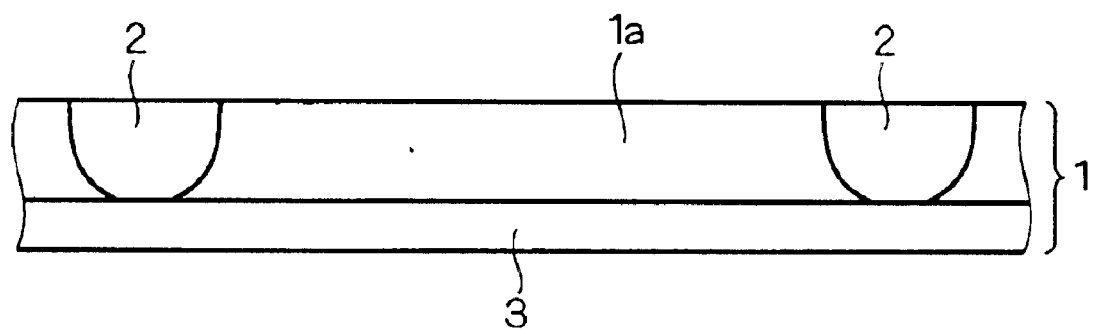
FIG. 13 is a cross section showing a variation of the first and second preferred embodiments.

FIG. 13 is a cross section showing a variation of the first and second preferred embodiments. After obtaining the semiconductor substrate of FIG. 2 by the manufacturing method of the above-discussed first or second preferred embodiment, the P-type impurity diffusion layer 3 is thinned by polishing the N$^-$-type silicon substrate 1 from the bottom surface side by a predetermined film thickness. This allows control of the impurity concentration in a surface of the P-type impurity diffusion layer 3 (the bottom surface of the N$^-$-type silicon substrate 1).

FIG. 4 of Japanese Patent Application Laid Open Gazette No. 7-307469 shows a method of manufacturing a semiconductor device where (a) a process step of forming a P-type impurity diffusion region which partially penetrates the N$^-$type substrate from its upper surface to its bottom surface by partially diffusing a P-type impurity from the upper surface and the bottom surface of the N$^-$type substrate and (b) a process step of forming a P-type impurity diffusion layer contiguous to the P-type impurity diffusion region by diffusing a P-type impurity entirely in the bottom surface of the N$^-$type substrate are executed in this order. The method, however, has a necessity to form masks at the same position of the upper surface and the bottom surface of the N$^-$type substrate in alignment, and this makes the manufacturing process complicate. On the other hand, the method of manufacturing the semiconductor substrate in the first and second preferred embodiments of the present invention does not have such a problem.

FIG. 5 of the above Gazette shows a method of manufacturing a semiconductor device where (a) a process step of forming an N$^-$type epitaxial layer on an upper surface of a P$^+$-type substrate and (b) a process step of forming a P$^+$-type impurity diffusion layer contiguous to the P$^+$-type substrate by diffusing partially in an upper surface of the N$^-$type epitaxial layer are executed in this order. The method, however, has a problem that both the manufacturing cost and the number of manufacturing process steps increase since the step of forming the N$^-$type epitaxial layer on the P$^+$-type substrate is needed. On the other hand, the method of manufacturing the semiconductor substrate in the first and second preferred embodiments of the present invention does not have such a problem.

Third Preferred Embodiment

Figure 14:
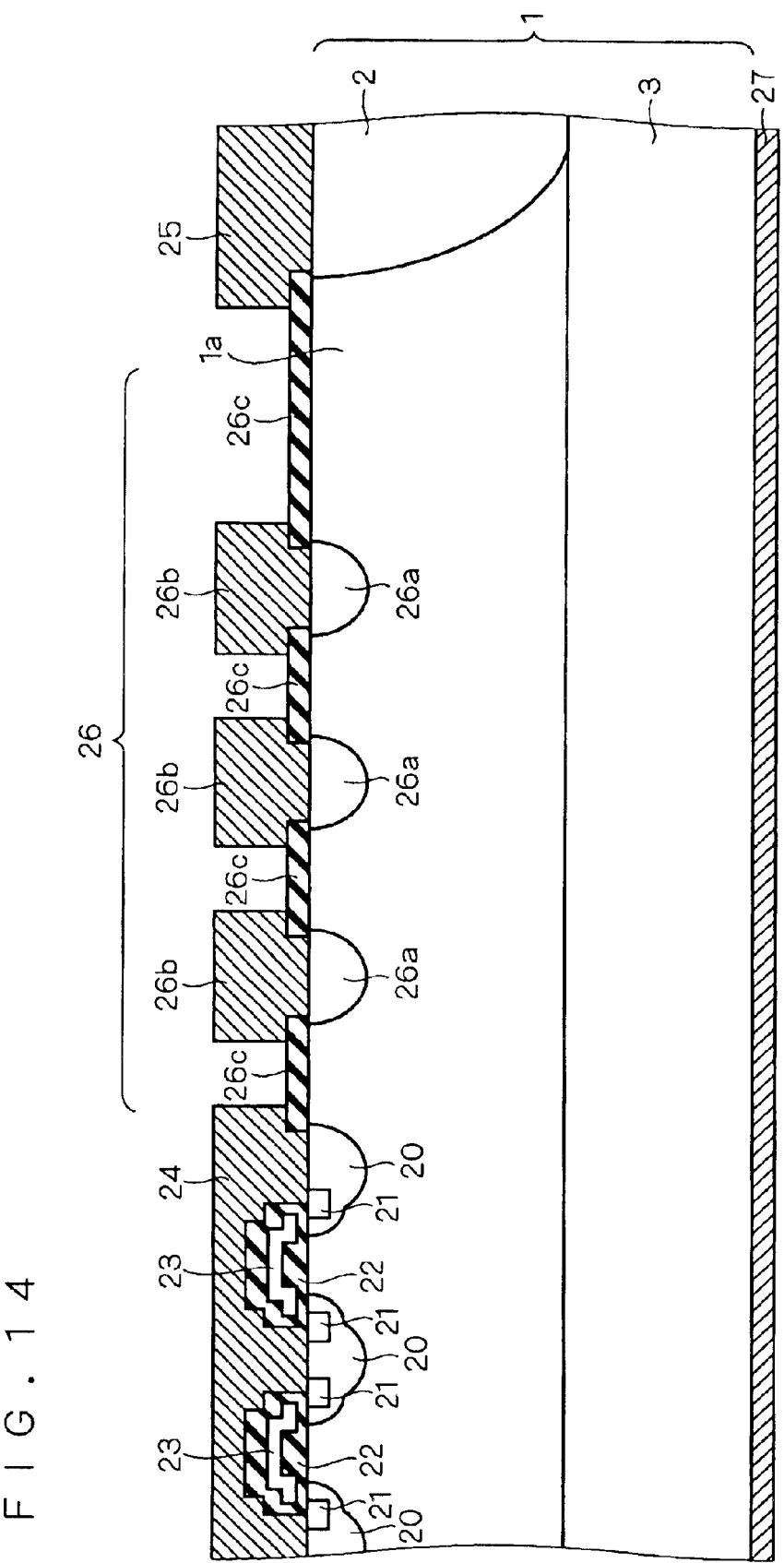
FIG. 14 is a cross section showing a structure of a semiconductor device in accordance with a third preferred embodiment of the present invention.

FIG. 14 is a cross section showing a structure of a semiconductor device (IGBT) in accordance with a third preferred embodiment of the present invention, which uses the semiconductor substrate of the first and second preferred embodiments. In the element formation region, P-type impurity regions 20 are formed partially in the upper surface of the N$^-$-type silicon substrate 1. In the P-type impurity regions 20, N$^+$-type impurity regions 21 are formed partially in the upper surface of the N$^-$-type silicon substrate 1. The P-type impurity regions 20 serve as a base of the IGBT, the N$^+$-type impurity regions 21 serve as an emitter thereof and the P-type impurity diffusion layer 3 serves as a collector thereof. Further, in the upper surface of the N$^-$-type silicon substrate 1, portions of the P-type impurity regions 20 which are positioned between the N$^+$-type impurity regions 21 and the N$^-$ region 1a serve as channel regions. On the channel regions, gate electrodes 23 are formed with part of insulating films 22 interposed therebetween. The gate electrodes 23 are made of, e.g., polysilicon. On the bottom surface of the N$^-$-type silicon substrate 1, a collector electrode 27 is formed, being in contact with the P-type impurity diffusion layer 3. On the upper surface of the N$^-$-type silicon substrate 1, an emitter electrode 24 is formed, being in contact with the P-type impurity regions 20 and the N$^+$-type impurity regions 21. An electrode 25 is connected to the P-type isolation region 2. The IGBT of the third preferred embodiment comprises a guard ring structure having P-type impurity regions 26a, electrodes 26b and insulating films 26c.

Figure 15:
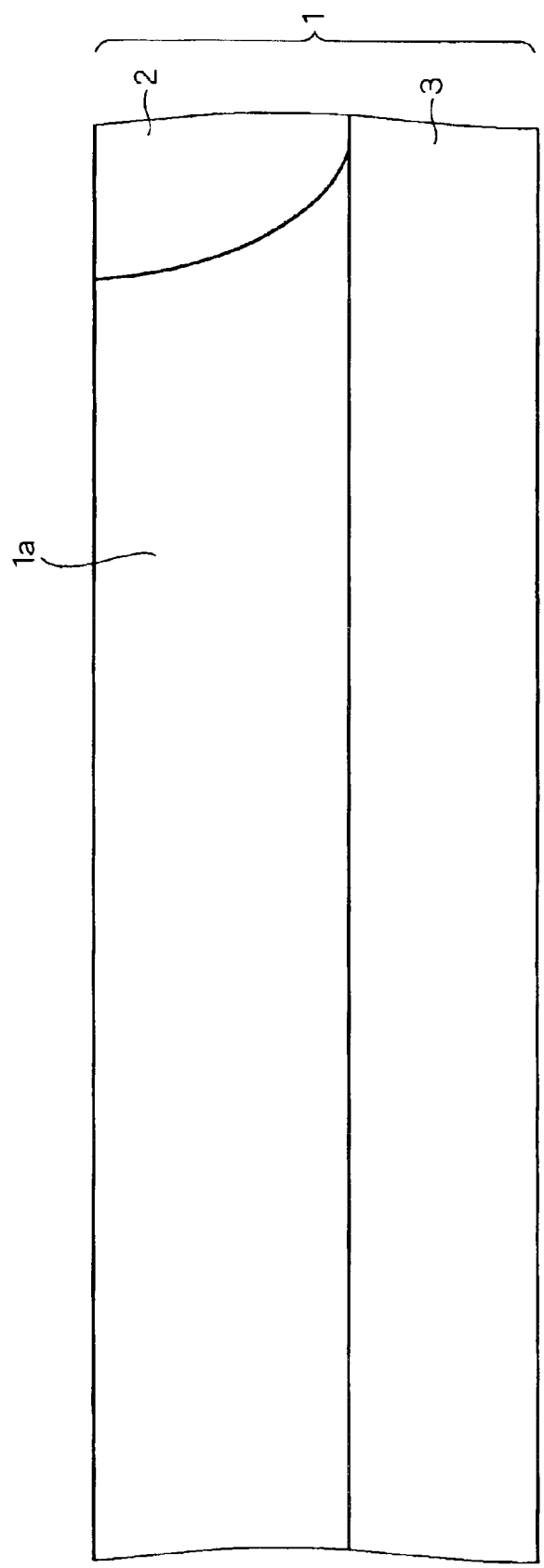
FIGS. 15 to 21 are cross sections showing a method of manufacturing the semiconductor device in accordance with the third preferred embodiment of the present invention step by step.

FIGS. 15 to 21 are cross sections showing a method of manufacturing the semiconductor device in accordance with the third preferred embodiment of the present invention step by step. Referring to FIG. 15, first, the semiconductor substrate of the above-discussed first or second preferred embodiment is prepared.

Figure 16:
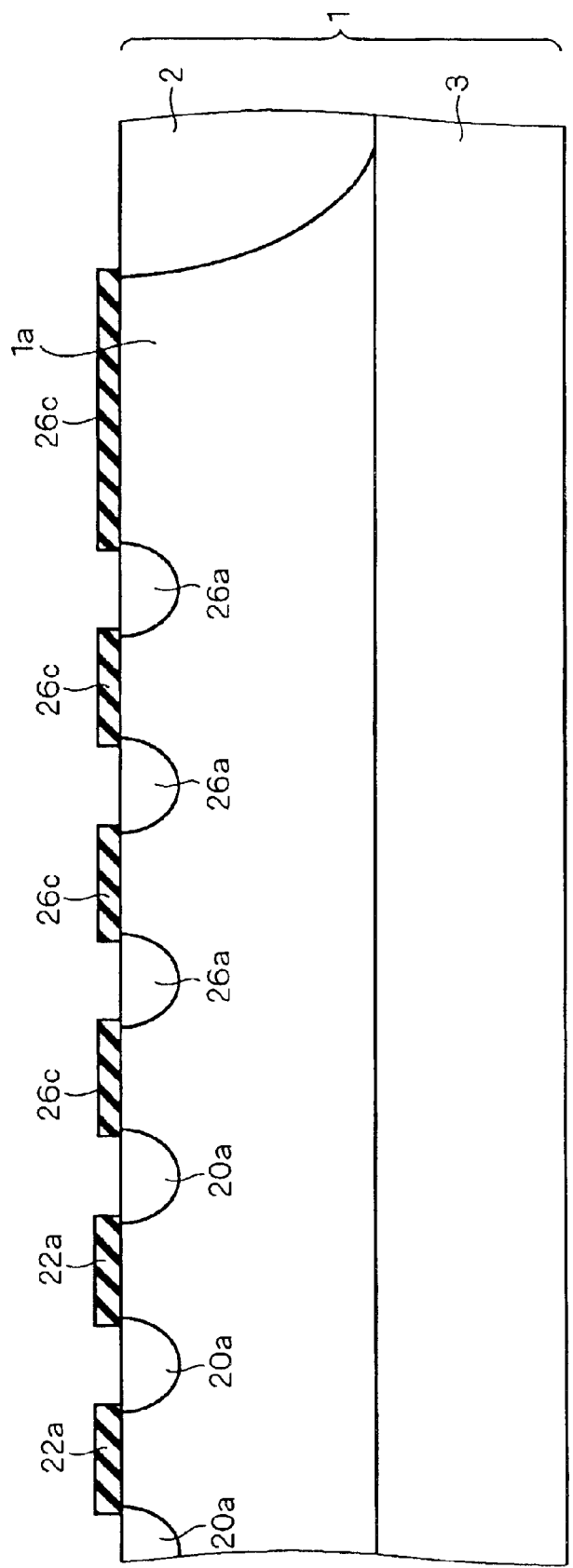

Referring to FIG. 16, next, a silicon oxide film is formed entirely on the upper surface of the N$^-$-type silicon substrate 1 by thermal oxidation. Subsequently, the silicon oxide film is patterned by photolithography and etching to form silicon oxide films 22a and 26c. Then, a P-type impurity is introduced into portions of the upper surface of the N$^-$-type silicon substrate 1 that are exposed from the silicon oxide films 22a and 26c by ion implantation to form the P-type impurity regions 20a and 26a.

Figure 17:
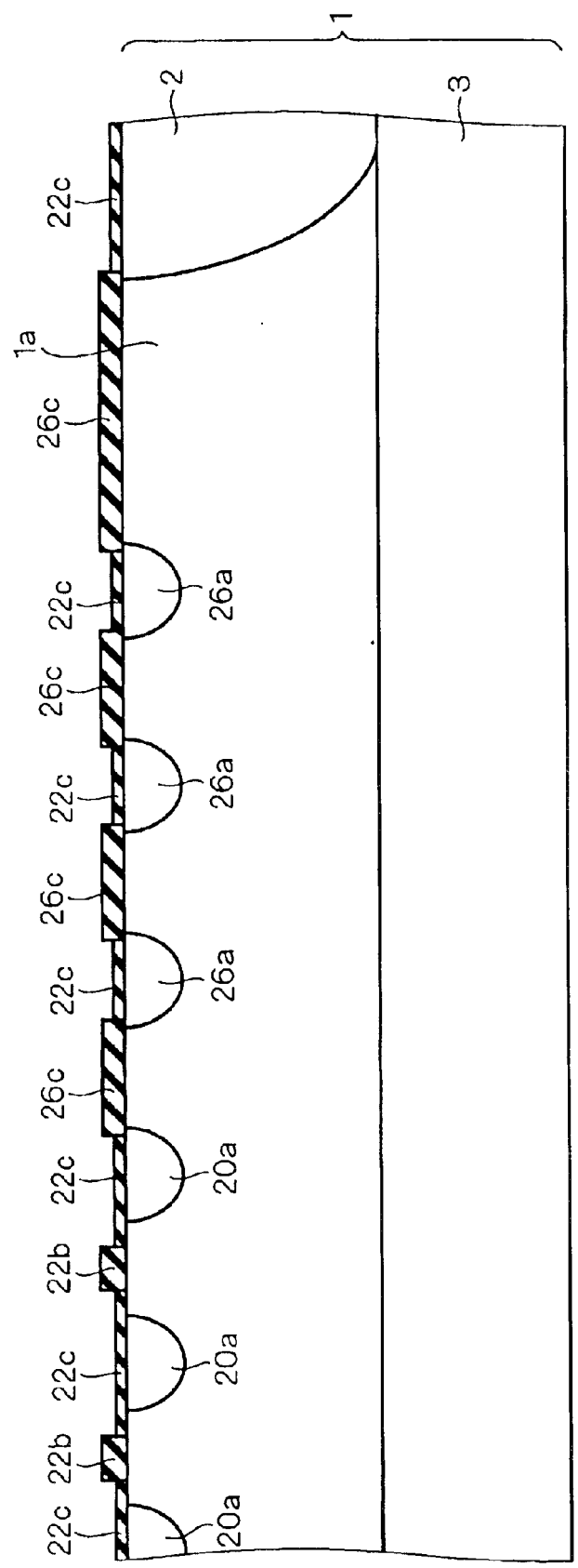

Referring to FIG. 17, next, the silicon oxide film 22a is patterned to form a silicon oxide film 22b, and thereafter, a silicon oxide film 22c, which is thinner than the silicon oxide films 22b and 26c, is formed on the upper surface of the N$^-$-type silicon substrate 1 by thermal oxidation.

Figure 18:
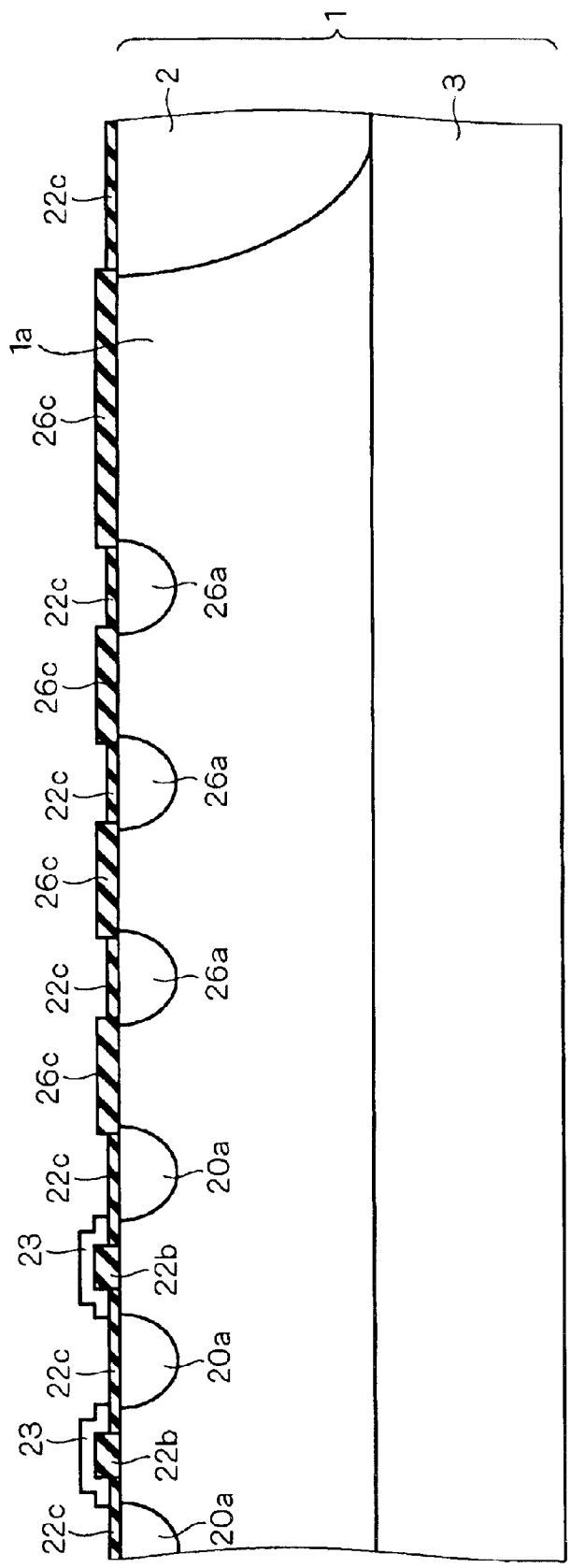

Referring to FIG. 18, next, a polysilicon film is entirely formed by CVD. Subsequently, the polysilicon film is patterned by photolithography and etching to form the gate electrodes 23.

Figure 19:
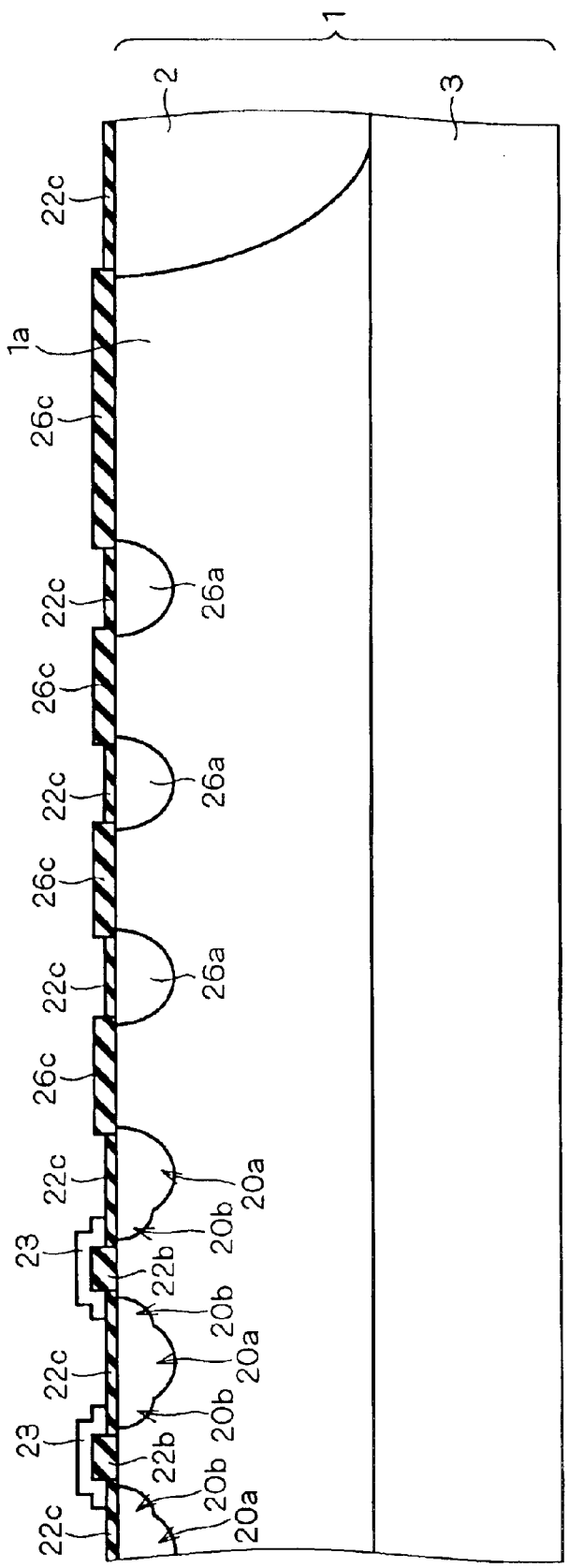

Referring to FIG. 19, next, a P-type impurity is introduced partially into the upper surface of the N$^-$-type silicon substrate 1 by photolithography and ion implantation to form P-type impurity regions 20b, which are shallower than the P-type impurity regions 20a. With the P-type impurity regions 20a and 20b, the P-type impurity regions 20 shown in FIG. 14 are formed.

Figure 20:
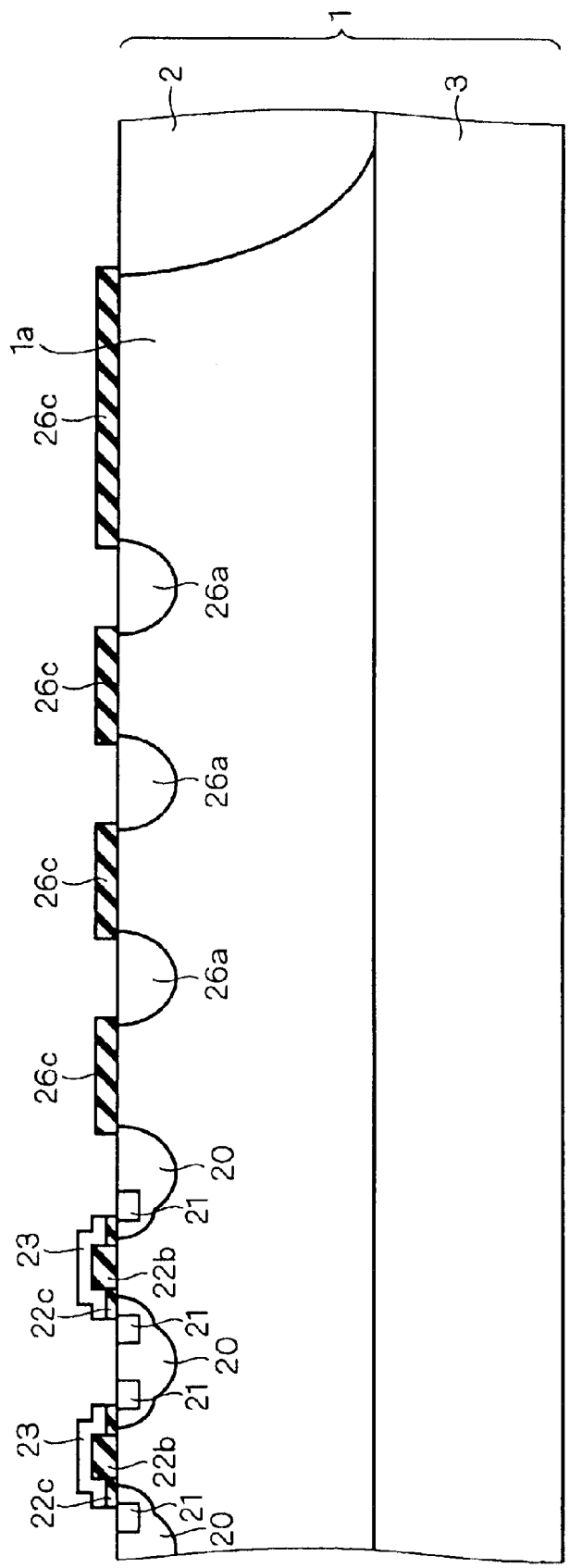

Referring to FIG. 20, next, portions of the silicon oxide film 22c that are exposed from the gate electrodes 23 are removed by etching. Portions of the silicon oxide film 22c that are left unremoved serve as gate insulating films. Subsequently, an N-type impurity is introduced partially into the upper surface of the P-type impurity regions 20 by photolithography and ion implantation to form the N$^+$-type impurity regions 21.

Figure 21:
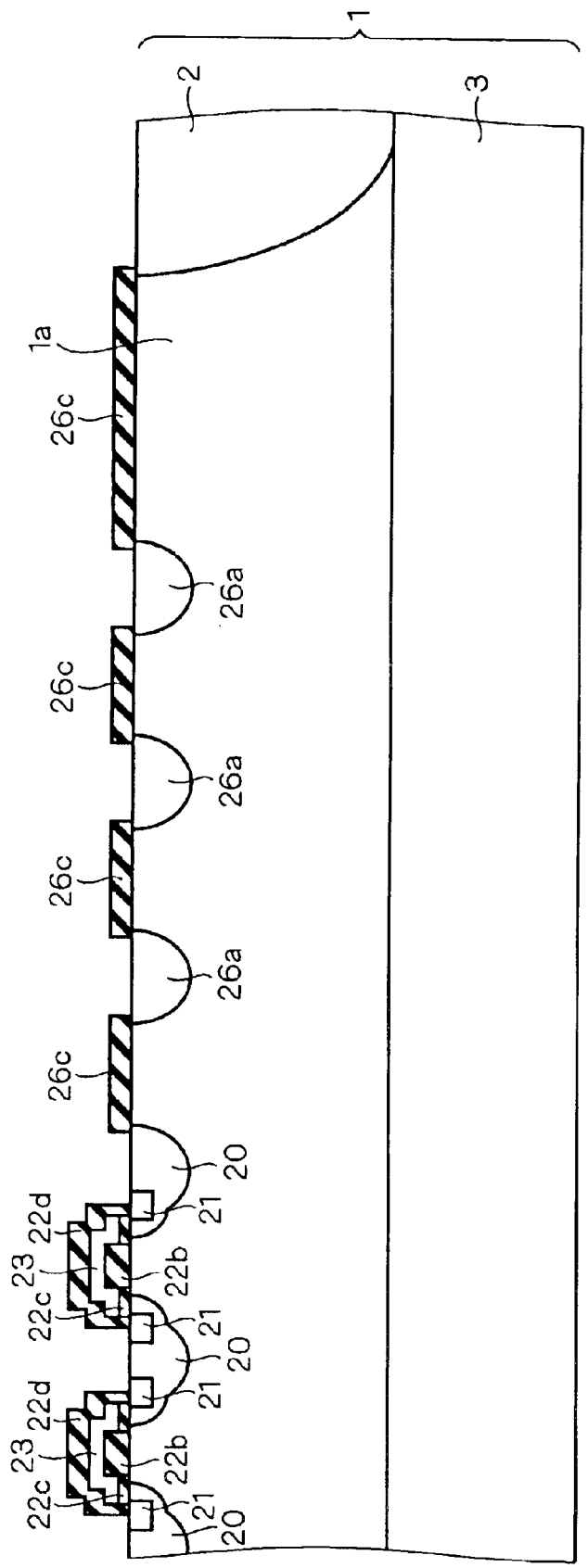

Referring to FIG. 21, next, a silicon oxide film is entirely formed by CVD. Subsequently, the silicon oxide film is patterned by photolithography and etching to form silicon oxide films 22d covering side surfaces and upper surfaces of the gate electrodes 23. With the silicon oxide films 22b to 22d, the insulating films 22 shown in FIG. 14 are formed.

Thereafter, the emitter electrode 24 and the electrodes 25 and 26b are formed on the upper surface of the N$^-$-type silicon substrate 1. Further, the collector electrode 27 is formed on the bottom surface of the N$^-$-type silicon substrate 1. Thus, the semiconductor device of FIG. 14 is obtained.

Now, a breakdown voltage of the semiconductor device of the third preferred embodiment will be examined. In the following discussion, a voltage applied to the P-type impurity regions 20 serving as the base is represented as "$V_{20}$" and a voltage applied to the P-type impurity diffusion layer 3 serving as the collector is represented as "$V_3$".

When a forward voltage $V_{20} < V_3$ is applied between the base and the collector, a depletion layer extends from the P-type impurity regions 20 to retain a forward breakdown voltage. In this case, an electric field is strong near an end of the P-type impurity region 20 having a sharp curve, but the electric field concentration near this end can be relieved by the guard ring structure 26. As a result, the forward breakdown voltage depending on the respective impurity concentrations, the shapes and the like of the P-type impurity regions 20, the N$^-$ region 1a and the P-type impurity diffusion layer 3 can be properly retained.

On the other hand, when a reverse voltage $V_{20} > V_3$ is applied between the base and the collector, a depletion layer extends from the P-type impurity diffusion layer 3 and the P-type isolation region 2 to retain a reverse breakdown voltage. In this case, since the P-type isolation region 2 has a gentle curve, the reverse breakdown voltage depending on the respective impurity concentrations, the shapes and the like of the P-type impurity regions 20, the N$^-$ region 1a, the P-type impurity diffusion layer 3 and the P-type isolation region 2 can be properly retained without providing a breakdown-voltage retaining structure such as the guard ring structure.

Figure 22:
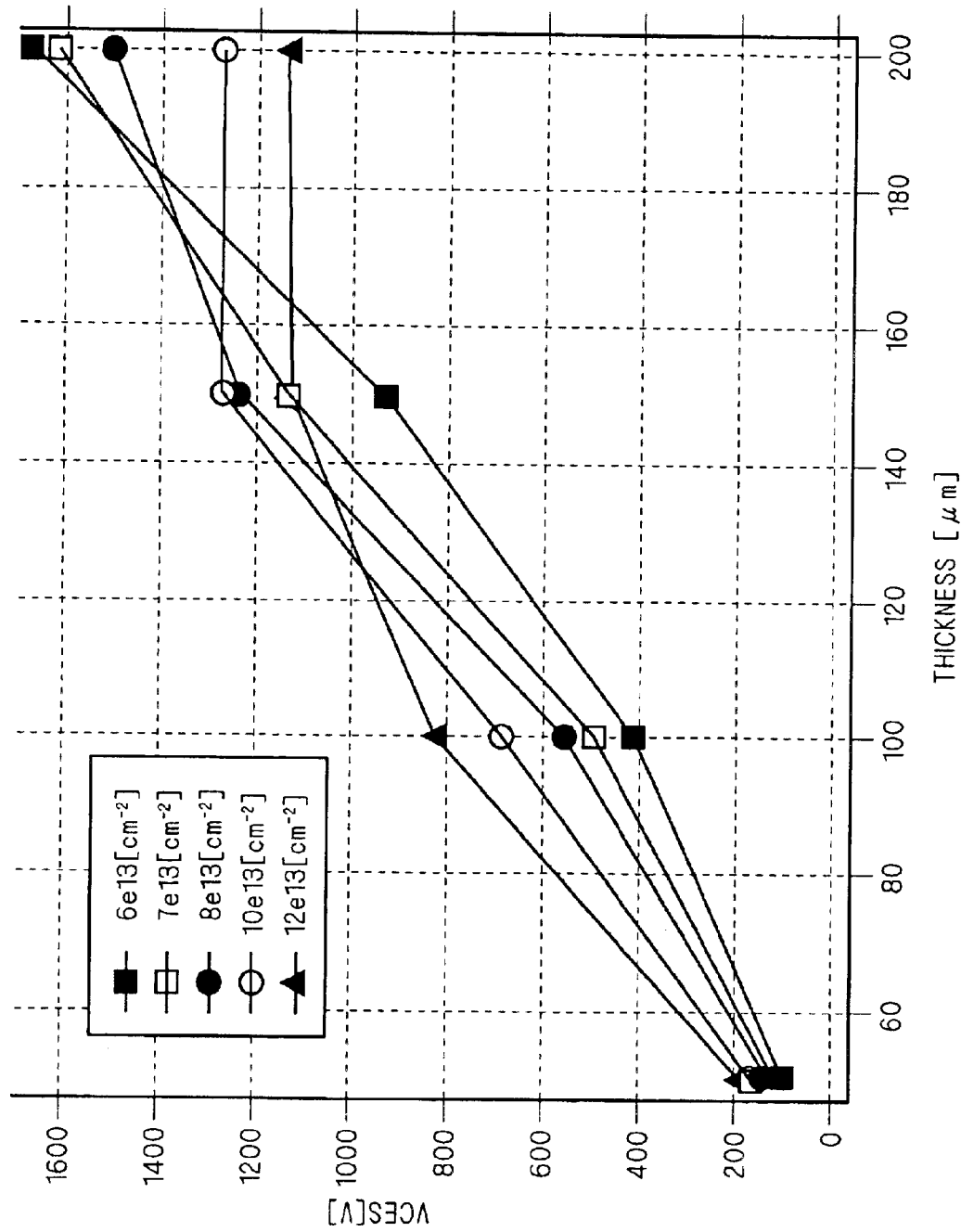
FIG. 22 is a graph showing a result of simulation on a relation between a thickness of an N⁻ region and a breakdown voltage.

A simulation is performed with the impurity concentration of the N$^-$ region 1a changed variously, to examine the relation between the thickness of the N$^-$ region 1a and a breakdown voltage VCES. FIG. 22 is a graph showing a result of the simulation. It can be seen from this graph that an arbitrary breakdown voltage can be obtained by controlling the impurity concentration and the film thickness of the N$^-$ region 1a.

Figure 23:
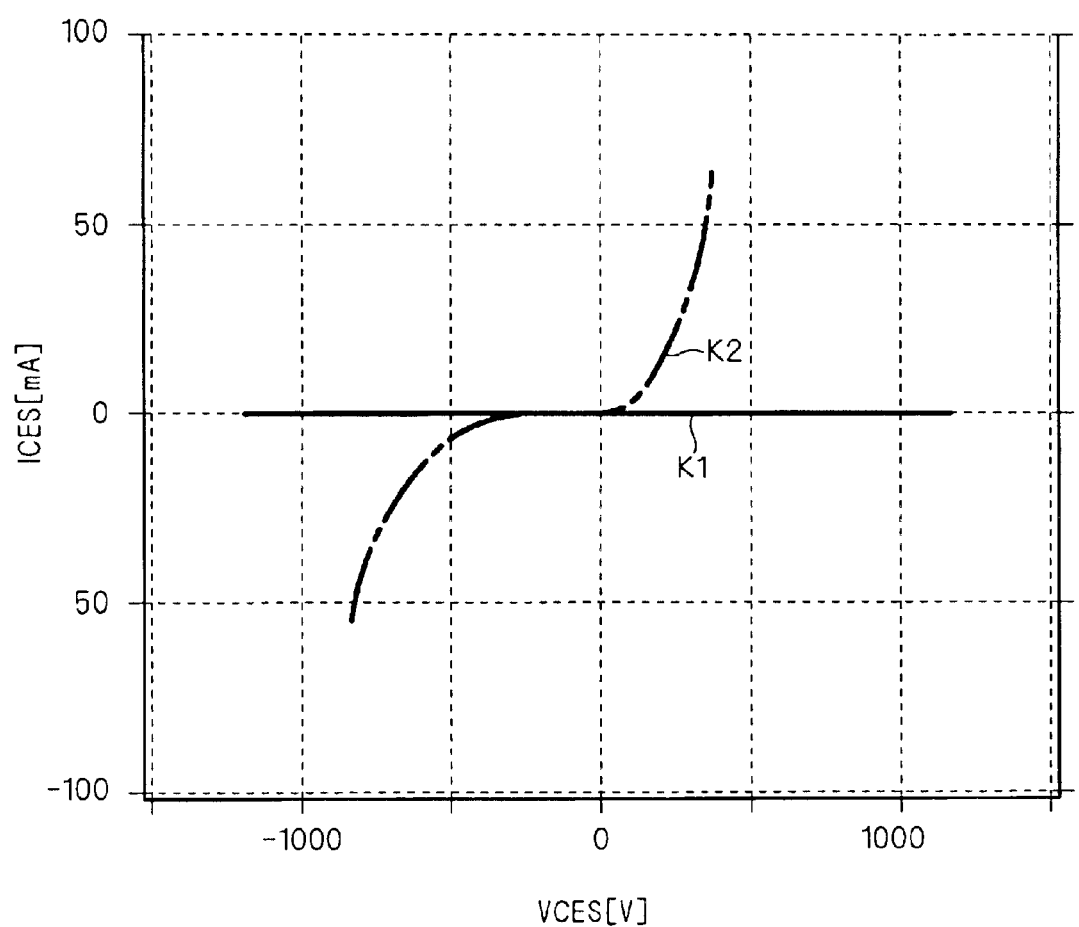
FIG. 23 is a graph showing a result of measurement of leakage current in measuring the breakdown voltage.

Further, leakage currents in measuring the breakdown voltage are measured on the respective cases where the P-type isolation region 2 is formed without forming the P-type impurity diffusion layer 3 and where the P-type isolation region 2 is formed after forming the P-type impurity diffusion layer 3. FIG. 23 is a graph showing a result of measurement. The characteristic K1 indicates a measurement result on the case where the P-type isolation region 2 is formed after forming the P-type impurity diffusion layer 3 and the characteristic K2 indicates a measurement result on the case where the P-type isolation region 2 is formed without forming the P-type impurity diffusion layer 3. It can be seen from this graph that it is possible to markedly reduce the leakage current ICES by forming the P-type isolation region 2 after forming the P-type impurity diffusion layer 3.

Next discussion will be made on a turn-on operation of the semiconductor device (IGBT) shown in FIG. 14. When a predetermined collector voltage VCE is applied between the emitter and the collector and a predetermined gate voltage VGE is applied between the emitter and the gate, the P-type impurity regions 20 below the gate insulating films 22 are reversed into N type, to form channel regions. Then, electrons are implanted into the N$^-$ region 1a from the N-type impurity regions 21 through the channel regions. With this implanted electrons, a forward bias is applied between the $N^-$ region 1a and the P-type impurity diffusion layer 3. Then, holes are implanted into the $N^-$ region 1a from the P-type impurity diffusion layer 3, to markedly reduce the resistance value of the $N^-$ region 1a and increase the current-carrying capacity. Thus, in the IGBT, the resistance of the $N^-$ region 1a is reduced by implanting holes from the P-type impurity diffusion layer 3.

Next discussion will be made on a turn-off operation. When the gate electrode VGE is made zero or reverse bias, the N-type channel regions are returned to P type and the implantation of electrons into the $N^-$ region 1a from the N-type impurity regions 21 is stopped. With this, the implantation of holes into the $N^-$ region 1a from the P-type impurity diffusion layer 3 is also stopped. The electrons and holes accumulated in the $N^-$ region 1a are emitted to the N-type impurity regions 21 or the impurity diffusion layer 3 by the electric field of the depletion layer extending from the P-type impurity regions 20 or recombined into extinction.

In the semiconductor device of the third preferred embodiment, as discussed above, the reverse breakdown voltage is retained by extension of the depletion layer from the P-type impurity diffusion layer 3 and the P-type isolation region 2. Therefore, since no $N^+$-type buffer layer can be formed between the P-type impurity diffusion layer 3 and the $N^-$ region 1a, unlike in the existing IGBT, it is necessary to thicken the film thickness of the $N^-$ region 1a to some degree. The film thickness of the $N^-$ region 1a may be determined on the basis of the graph of FIG. 22 with the relation between the required breakdown voltage and the impurity concentration of the $N^-$ region 1a.

Thus, in the semiconductor device and the method of manufacturing the same according to the third preferred embodiment, both the forward breakdown voltage and the reverse breakdown voltage of the IGBT can be retained. Therefore, the semiconductor device of the third preferred embodiment can be applied to a power device required to have bidirectional breakdown voltages, such as a bidirectional switch used in an AC matrix converter.

Fourth Preferred Embodiment

FIG. 24 is a cross section showing a structure of a semiconductor device in accordance with a fourth preferred embodiment of the present invention. The semiconductor device of the fourth preferred embodiment has a basic structure of the semiconductor device of the third preferred embodiment and a local lifetime region 30 is additionally formed in the $N^-$ region 1a. The local lifetime region 30 can be formed, e.g., by ion implantation of an impurity such as proton or helium into the $N^-$ region 1a from the bottom surface side of the $N^-$-type silicon substrate 1 through the P-type impurity diffusion layer 3 after obtaining the structure of FIG. 21. Naturally, the ion implantation may be also performed from the upper surface side of the $N^-$-type silicon substrate 1.

As discussed above, the semiconductor device of the third preferred embodiment has a necessity to thicken the film thickness of the $N^-$ region 1a to some degree. This needs more electrons to be implanted into the $N^-$ region 1a from the N-type impurity regions 21 in the turn-on operation. Further, in the turn-off operation, a region where no depletion layer is formed remains at a portion of the $N^-$ region 1a near the P-type impurity diffusion layer 3. Then, in the region with no depletion layer, the main factor of extinction of carriers in the turn-off is not emission by the electric field but recombination, and therefore the time required for the turn-off becomes relatively longer.

Since the recombination of carriers in this region is accelerated by formation of the local lifetime region 30 particularly in the region of the $N^-$ region 1a where no depletion layer is formed, it is possible to shorten the time required for the turn-off.

Fifth Preferred Embodiment

Figure 26:
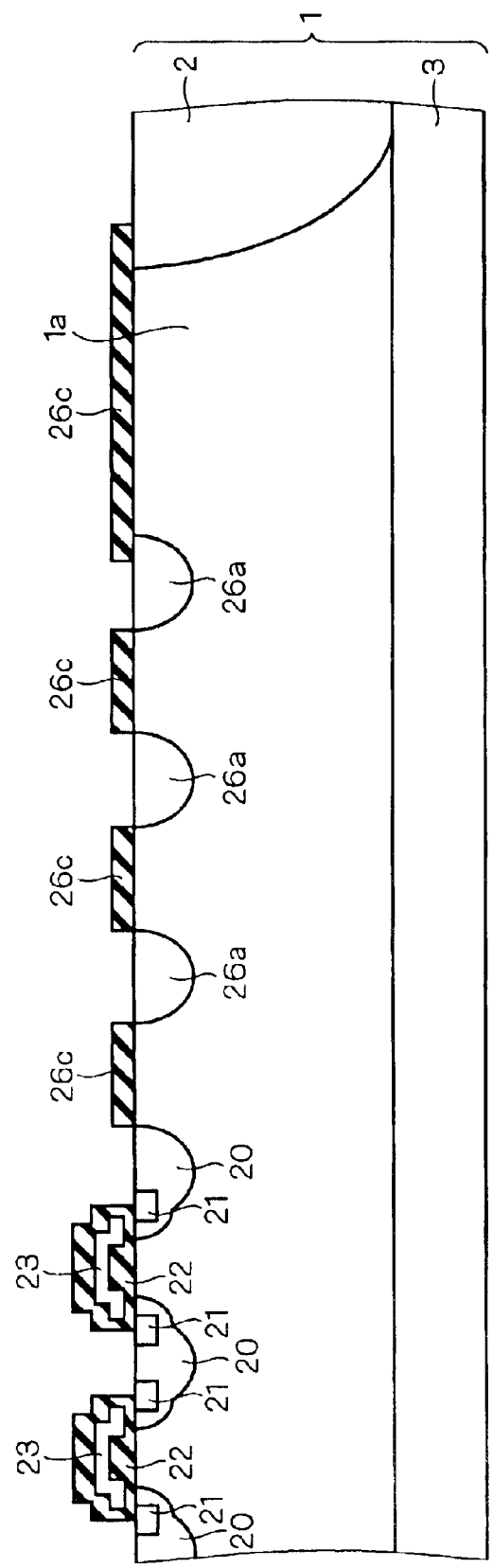
FIG. 26 is a cross section showing a process in a method of manufacturing the semiconductor device in accordance with the fifth preferred embodiment of the present invention.

FIG. 25 is a cross section showing a structure of a semiconductor device in accordance with a fifth preferred embodiment of the present invention. FIG. 26 is a cross section showing a process in a method of manufacturing the semiconductor device in accordance with the fifth preferred embodiment of the present invention. After obtaining the structure of FIG. 21, with reference to FIG. 26, the P-type impurity diffusion layer 3 is thinned by polishing the $N^-$-type silicon substrate 1 by a predetermined thickness from the bottom surface side thereof. After that, like in the fourth preferred embodiment, the local lifetime region 30 is formed by ion implantation of a predetermined impurity into the $N^-$ region 1a from the bottom surface side of the $N^-$-type silicon substrate 1 through the P-type impurity diffusion layer 3. With this, the semiconductor device of FIG. 25 is obtained.

Thus, in the semiconductor device and the method of manufacturing the same according to the fifth preferred embodiment, the local lifetime region 30 is formed in the $N^-$ region 1a by ion implantation of a predetermined impurity from the bottom surface side of the $N^-$-type silicon substrate 1 after thinning the P-type impurity diffusion layer 3. Therefore, as compared with the fourth preferred embodiment, it becomes possible to form the local lifetime region 30 nearer to the upper surface of the $N^-$-type silicon substrate 1. In other words, the depth of the local lifetime region 30 to be formed can be determined more flexibly.

Sixth Preferred Embodiment

When the local lifetime region 30 is formed in the $N^-$ region 1a by implanting protons, the implanted protons are made to act as a donor due to the annealing after the implantation; as a result, a portion of the $N^-$ region 1a in which the protons are implanted shows a higher impurity concentration.

Figure 27:
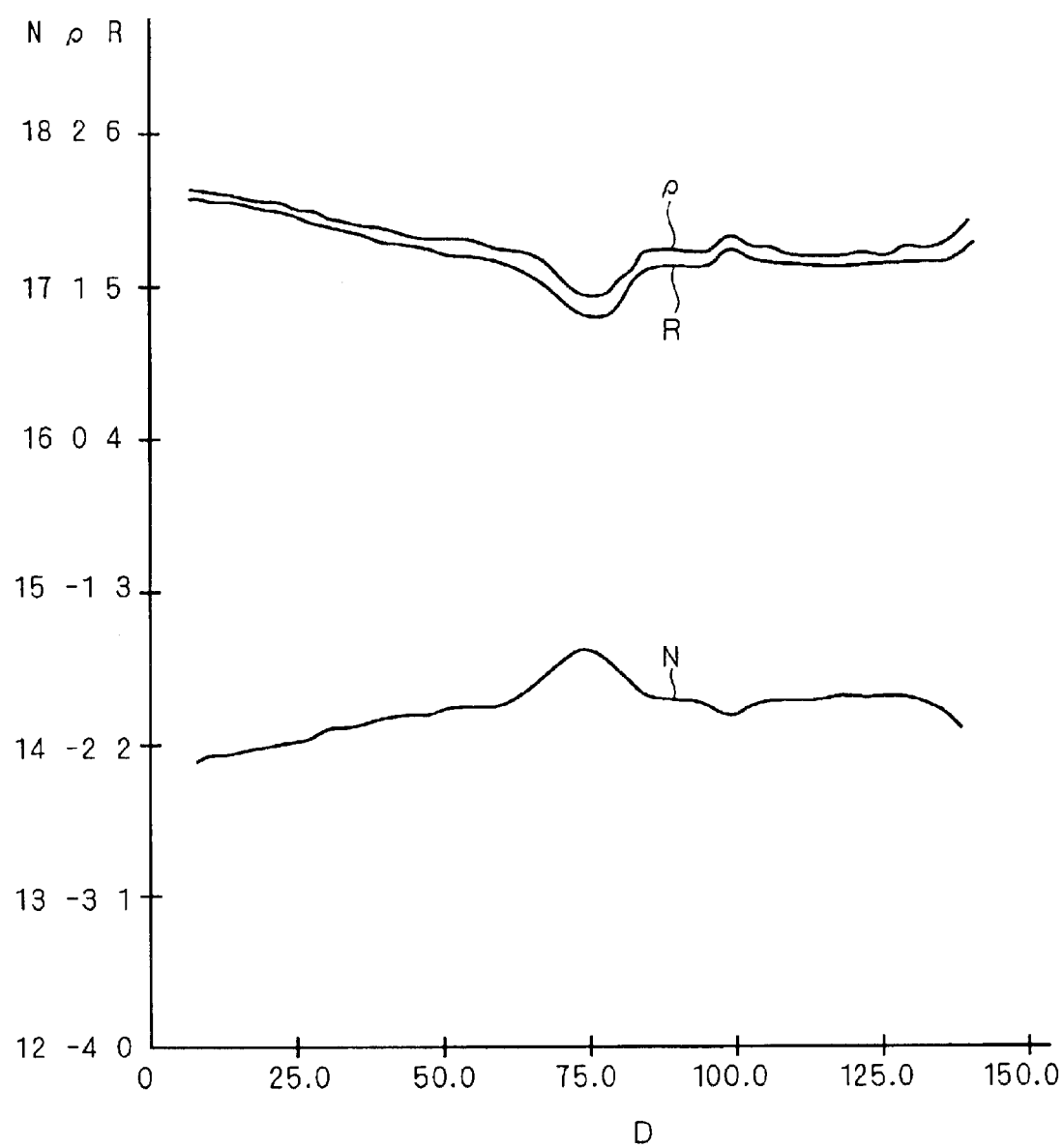
FIG. 27 is a graph showing a result of SR evaluation on a predetermined monitor wafer.

FIG. 27 is a graph showing the result of SR evaluation on a predetermined monitor wafer. The monitor wafer is fabricated by ion-implanting proton into substantially a middle region, with respect to a film thickness direction, of the $N^-$-type silicon substrate having a film thickness of 150 $\mu$m (that is, into a region at or in the vicinity of a depth of 75 $\mu$m), and subsequently being annealed. In FIG. 27, the horizontal axis indicates the depth D ($\mu$m) from the upper surface of the $N^-$-type silicon substrate and the vertical axis indicates the concentration N ($cm^{-3}$), the resistivity $\rho$ ($\Omega \cdot cm$) and the resistance R ($\Omega$). It can be seen from FIG. 27 that the concentration N in the $N^-$ region 1a has increased at or in the vicinity of a depth of about 75 $\mu$m as the result of the protons having been made to act as a donor due to the annealing.

Figure 28:
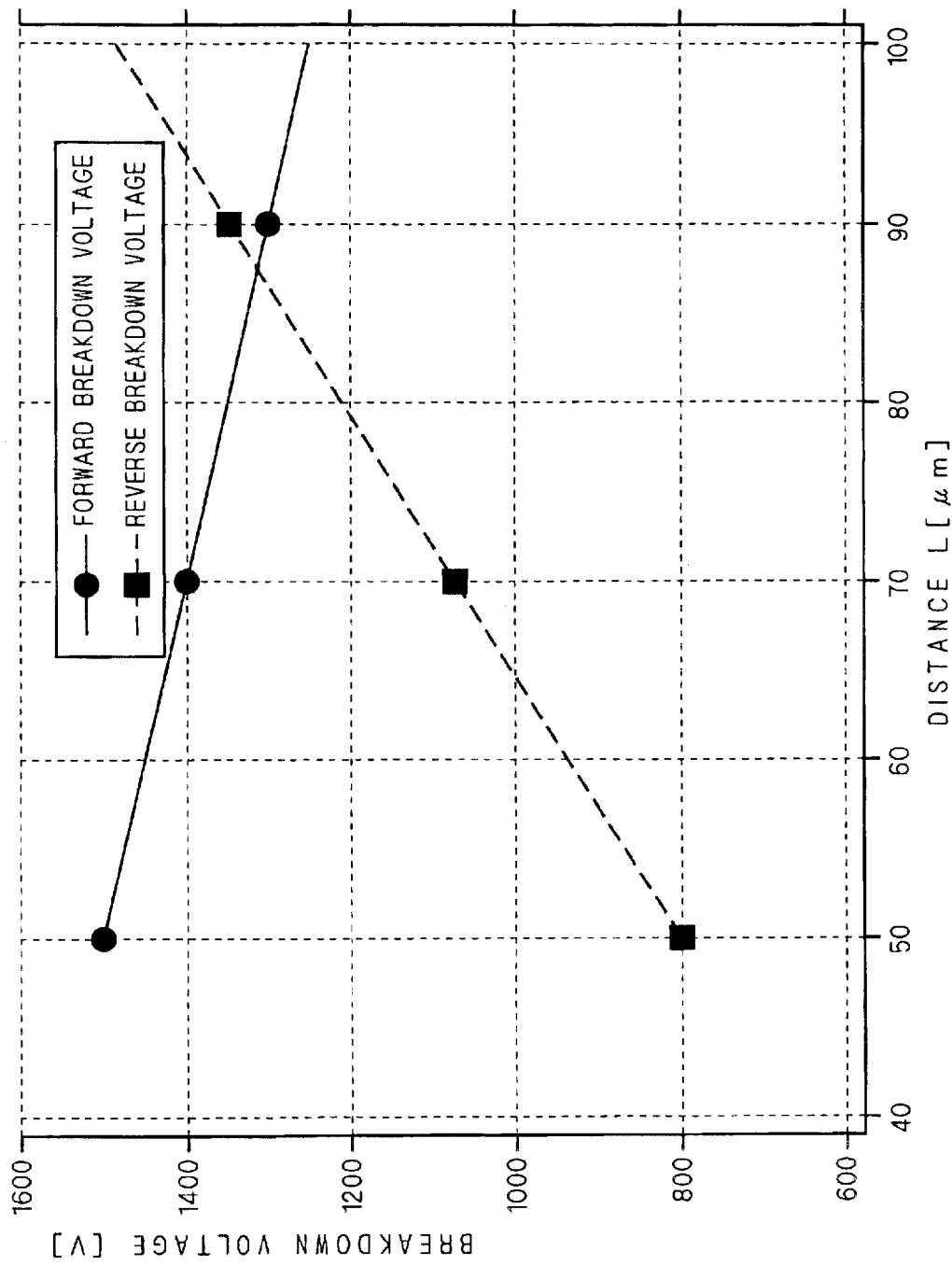
FIG. 28 is a graph showing a result of study on a relation between implantation depth of proton and the breakdown voltage.

Next, in the semiconductor device according to the foregoing third preferred embodiment, it was studied how the respective absolute values of the forward breakdown voltage and the reverse breakdown voltage vary according to the depth of proton implantation to the $N^-$ region 1a in the case where the film thickness of the $N^-$ region 1a is 170 $\mu$m. FIG. 28 is a graph showing a result of the study. The horizontal axis of the graph indicates a distance L ($\mu$m) from the interface between the $N^-$ region 1a and the P-type impurity diffusion layer 3 to the location where protons are implanted. The vertical axis of the graph indicates respective absolute values (V) of the forward breakdown voltage and the reverse breakdown voltage. It can be seen from FIG. 28 that when the distance L is longer, the absolute value of the reverse breakdown voltage is greater, whereas when the distance L is shorter, the absolute value of the forward breakdown voltage is greater. The reason why the absolute value of the reverse breakdown voltage is less when the distance L is shorter is that the impurity concentration of the N⁻ region 1a in the portion where protons are implanted increases due to the protons acting as a donor.

As will be understood from FIG. 28, if the distance L is too short, the absolute value of the reverse breakdown voltage becomes small, but on the other hand, if the distance L is too long, the absolute value of the forward breakdown voltage becomes small. Therefore, when the local lifetime region is formed by implanting protons, it is desirable that the protons be implanted in a substantially middle region of the N⁻ region 1a with respect to the film thickness direction. In the example shown in FIG. 28, by setting the distance L to be about 80 to 100 μm, it is possible to obtain a semiconductor device in which the respective absolute values of the forward breakdown voltage and the reverse breakdown voltage exceed 1200 (V).

Figure 29:
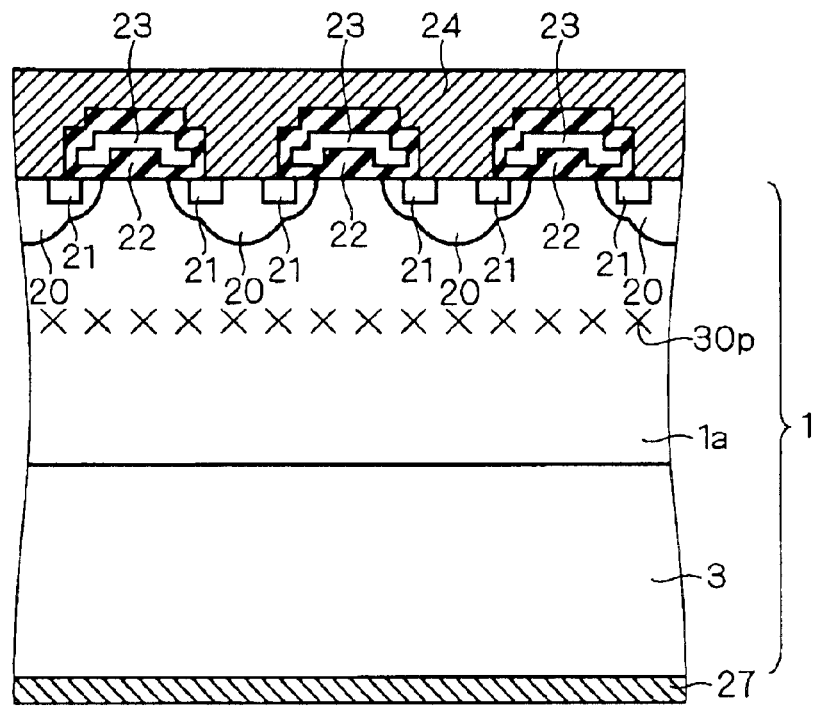
FIG. 29 is a cross section showing a structure of a semiconductor device in accordance with a sixth preferred embodiment of the present invention, based on the semiconductor device shown in FIG. 24.

FIG. 29 is a cross section showing a structure of a semiconductor device in accordance with the sixth preferred embodiment, based on the semiconductor device shown in FIG. 24. In place of the local lifetime region 30 shown in FIG. 24, a local lifetime region 30p is formed. The local lifetime region 30p is formed by ion-implanting protons into the substantially middle region of the N⁻ region 1a with respect to the film thickness direction, from the bottom surface side of the N⁻-type silicon substrate 1 through the P-type impurity diffusion layer 3.

Figure 30:
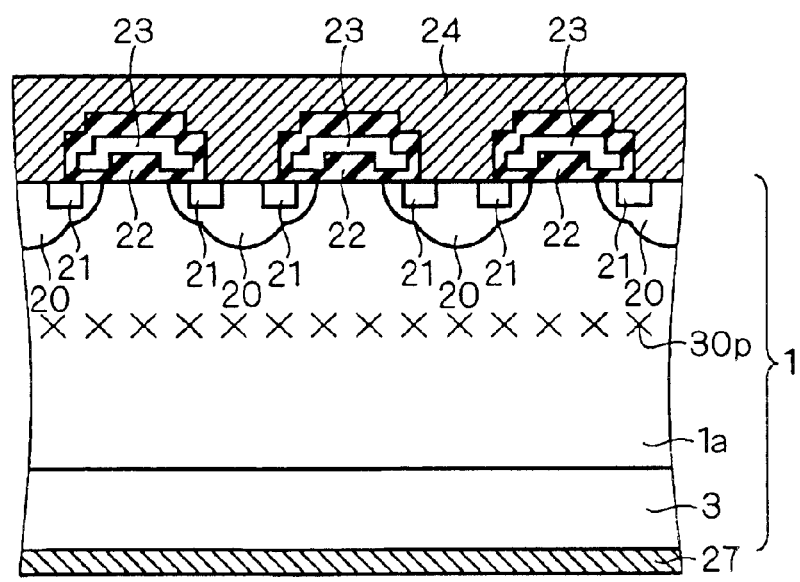
FIG. 30 is a cross section showing a structure of a semiconductor device in accordance with the sixth preferred embodiment of the present invention, based on the semiconductor device shown in FIG. 25.

FIG. 30 is a cross section showing a structure of a semiconductor device in accordance with the sixth preferred embodiment, based on the semiconductor device shown in FIG. 25. In place of the local lifetime region 30 shown in FIG. 25, a local lifetime region 30p is formed. As in the semiconductor device shown in FIG. 29, the local lifetime region 30p is formed by ion-implanting protons into the substantially middle region of the N⁻region 1a with respect to the film thickness direction, from the bottom surface side of the N⁻-type silicon substrate 1 through the P-type impurity diffusion layer 3.

Figure 31:
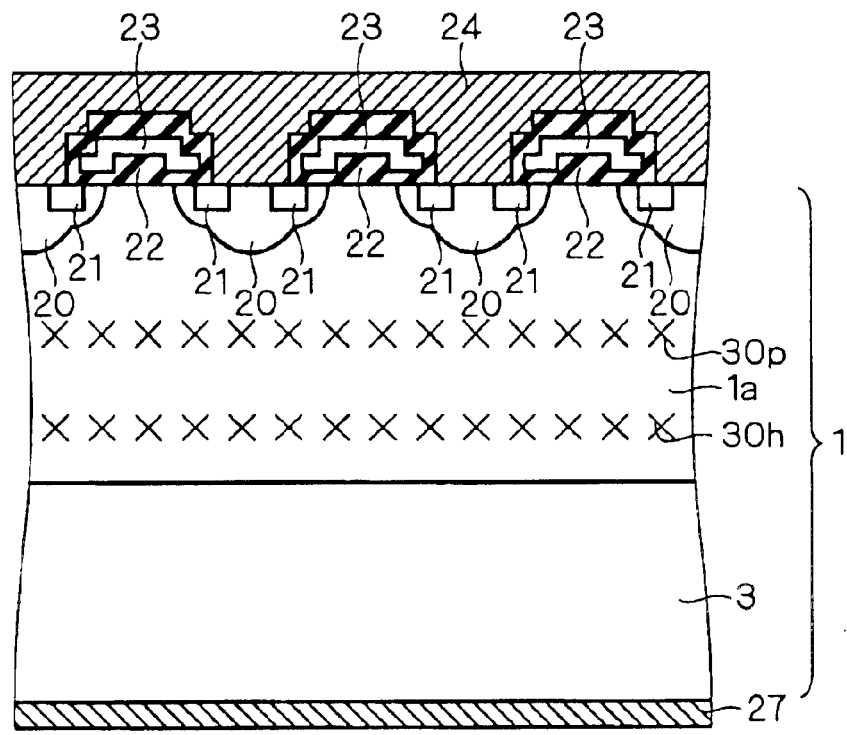
FIG. 31 is a cross section showing a structure of a semiconductor device in accordance with a first variation of the sixth preferred embodiment of the present invention.

FIG. 31 is a cross section showing a structure of a semiconductor device in accordance with a first variation of the sixth preferred embodiment. A local lifetime region 30h is additionally provided in the N⁻ region 1a, based on the semiconductor device shown in FIG. 29. The local lifetime region 30h is formed by ion-implanting helium into a deep region that is nearer to the P-type impurity diffusion layer 3 than the local lifetime region 30p, from the bottom surface side of the N⁻-type silicon substrate 1 through the P-type impurity diffusion layer 3.

Figure 32:
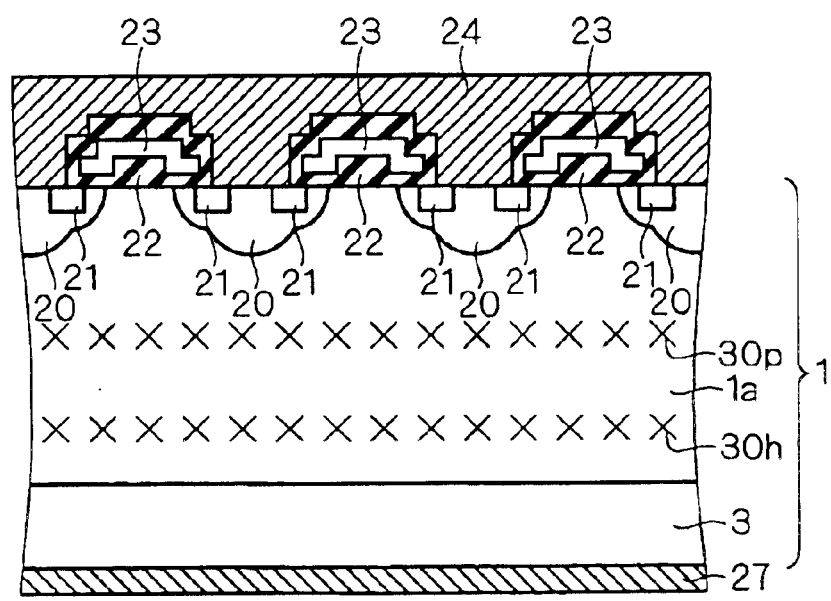
FIG. 32 is a cross section showing a structure of a semiconductor device in accordance with a second variation of the sixth preferred embodiment of the present invention.

FIG. 32 is a cross section showing a structure of a semiconductor device in accordance with a second variation of the sixth preferred embodiment. A local lifetime region 30h is additionally provided in the N⁻ region 1a, based on the semiconductor device shown in FIG. 30. As in the semiconductor device shown in FIG. 31, the local lifetime region 30h is formed by ion-implanting helium into a deep region that is nearer to the P-type impurity diffusion layer 3 than the local lifetime region 30p, from the bottom surface side of the N⁻-type silicon substrate 1 through the P-type impurity diffusion layer 3.

Unlike proton, helium does not act as a donor. For this reason, even when the local lifetime region 30h is formed at or in the vicinity of the interface between the N⁻ region 1a and the P-type impurity diffusion layer 3, the absolute value of the reverse breakdown voltage does not decrease. Recombination of carriers is further accelerated by formation of not only the local lifetime region 30p but also the local lifetime region 30h, and accordingly, it is possible to further shorten the time required for the turn-off.

Thus, in the semiconductor device and the method of manufacturing the same according to the sixth preferred embodiment, the local lifetime region 30p is formed by ion-implanting protons in the substantially middle region of the N⁻ region 1a with respect to the film thickness direction. Accordingly, either one of the absolute value of one of the forward breakdown voltage or the reverse breakdown voltage does not reduce extremely, and both of the forward breakdown voltage and the reverse breakdown voltage of IGBT can be retained at high level. Therefore, the semiconductor device of the sixth preferred embodiment can be applied to a power device required to have bidirectional breakdown voltages, such as a bidirectional switch used in an AC matrix converter.

Though the N-channel IGBT has been discussed in the above-discussed first to sixth preferred embodiments, the present invention can be also applied to a P-channel IGBT. Further, though the IGBT in which the gate is formed on the silicon substrate has been discussed, the present invention can be also applied to another type of IGBT in which a gate is buried in a trench formed in the silicon substrate (trench gate type IGBT).

While the invention has been shown and described in detail, the foregoing description is in all aspects illustrative and not restrictive. It is therefore understood that numerous modifications and variations can be devised without departing from the scope of the invention.

What is claimed is:

1. A semiconductor substrate, comprising:
   a substrate of a first conductivity type, having a first main surface and a second main surface which are opposed to each other;
   an impurity diffusion layer of a second conductivity type different from said first conductivity type, being formed in said first main surface by diffusing an impurity; and
   an impurity diffusion region of said second conductivity type, being formed partially in said second main surface by diffusing an impurity, having a bottom surface reaching said impurity diffusion layer and surrounding a portion of said substrate which has said first conductivity type in a plan view,
   wherein said portion surrounded by said impurity diffusion region is defined as an element formation region.

2. The semiconductor substrate according to claim 1, wherein
   the thickness of said impurity diffusion layer is almost equal to the depth of said impurity diffusion region from said second main surface.

3. The semiconductor substrate according to claim 1, wherein
   the impurity concentration distribution of said impurity diffusion layer from said first main surface towards the inside of said substrate is almost equal to the impurity concentration distribution of said impurity diffusion region from said second main surface towards the inside of said substrate.

4. The semiconductor substrate according to claim 1, wherein
   the thickness of said impurity diffusion layer is thinner than the depth of said impurity diffusion region from said second main surface.

5. A semiconductor device, comprising:
a semiconductor substrate which comprises (a) a substrate of a first conductivity type, having a first main surface and a second main surface which are opposed to each other, (b) an impurity diffusion layer of a second conductivity type different from said first conductivity type, being formed in said first main surface by diffusing an impurity and (c) an impurity diffusion region of said second conductivity type, being formed partially in said second main surface by diffusing an impurity, having a bottom surface reaching said impurity diffusion layer and surrounding a portion of said substrate which has said first conductivity type in a plan view, said portion surrounded by said impurity diffusion region being defined as an element formation region; and
a first impurity region of said second conductivity type, being formed partially in said second main surface in said element formation region.

6. The semiconductor device according to claim 5, further comprising
a second impurity region of said first conductivity type, being formed partially in said second main surface in said first impurity region,
wherein said first impurity region serves as a base of a transistor,
said second impurity region serves as an emitter of said transistor, and
said impurity diffusion layer serves as a collector of said transistor.

7. The semiconductor device according to claim 6, further comprising
a gate electrode formed on said second main surface with a gate insulating film interposed therebetween above said first impurity region positioned between said second impurity region and a portion of said substrate which has said first conductivity type.

8. The semiconductor device according to claim 6, further comprising
a local lifetime region formed in said portion of said substrate which has said first conductivity type.

9. The semiconductor device according to claim 8, wherein said local lifetime region has a first local lifetime region formed by implanting proton into a substantially middle region, with respect to a film thickness direction, of said portion of said substrate which has said first conductivity type.

10. The semiconductor device according to claim 9, wherein said local lifetime region further has a second local lifetime region formed by implanting helium into a deep region of said portion of said substrate which has said first conductivity type, said deep region being nearer to said impurity diffusion layer than said first local lifetime region.

11. The semiconductor device according to claim 6, further comprising:
a first main electrode formed on said first main surface, being in contact with said impurity diffusion layer; and
a second main electrode formed on said second main surface, being in contact with said first and second impurity regions.

12. A semiconductor device comprising:
a semiconductor substrate which comprises (a) a substrate of a first conductivity type, having a first main surface and a second main surface which are opposed to each other, (b) an impurity diffusion layer of a second conductivity type different from said first conductivity type, being formed in said first main surface and serving as a collector of a transistor, and (c) an impurity diffusion region of said second conductivity type, being formed partially in said second main surface, having a bottom surface reaching said impurity diffusion layer and surrounding a portion of said substrate which has said first conductivity type in a plan view, said portion surrounded by said impurity diffusion region being defined as an element formation region;
a first impurity region of said second conductivity type, being formed partially in said second main surface in said element formation region and serving as a base of said transistor;
a second impurity region of said first conductivity type, being formed partially in said second main surface in said first impurity region and serving as an emitter of said transistor;
a gate electrode formed on said second main surface with a gate insulating film interposed therebetween above said first impurity region positioned between said second impurity region and a portion of said substrate which has said first conductivity type; and
a first local lifetime region formed by implanting protons into a substantially middle region, with respect to a film thickness direction, of said portion of said substrate which has said first conductivity type.

13. The semiconductor device according to claim 12, further comprising a second local lifetime region formed by implanting helium into a deep region of said portion of said substrate which has said first conductivity type, said deep region being nearer to said impurity diffusion layer than said first local lifetime region.

14. A method of manufacturing a semiconductor substrate, comprising the steps of:
(a) preparing a substrate of a first conductivity type, having a first main surface and a second main surface which are opposed to each other;
(b) forming an impurity diffusion layer of a second conductivity type different from said first conductivity type by diffusing a first impurity into said substrate from said first main surface; and
(c) forming an impurity diffusion region of said second conductivity type by diffusing a second impurity into said substrate from part of said second main surface, to have a bottom surface reaching said impurity diffusion layer and surround a portion of said substrate which has said first conductivity type in a plan view,
wherein said portion surrounded by said impurity diffusion region is defined as an element formation region.

15. The method according to claim 14, wherein said step (b) has the steps of:
(b-1) forming a film containing said first impurity on said first main surface; and
(b-2) diffusing said first impurity into said substrate from said film.

16. The method according to claim 14, wherein said step (c) has the steps of:
(c-1) forming a first film partially on said second main surface;
(c-2) forming a second film containing said second impurity on said second main surface to cover said first film; and
(c-3) diffusing said second impurity into said substrate from said second film.

17. The method according to claim 14, wherein said step (b) has the steps of:

(b-1) forming a first film containing said first impurity on said first main surface; and (b-2) diffusing said first impurity into said substrate from said first film, said step (c) has the steps of:

(c-1) forming a second film partially on said second main surface;

(c-2) forming a third film containing said second impurity on said second main surface to cover said second film; and (c-3) diffusing said second impurity into said substrate from said third film, and said steps (b-2) and (c-3) are executed in the same process.

18. The method according to claim 14, further comprising the steps of:

(d) forming a first oxide film entirely on said first main surface and a second oxide film entirely on said second main surface by oxidizing a surface of said substrate;

(e) removing the whole of said first oxide film; and (f) removing part of said second oxide film, wherein said steps (d) to (f) are executed before said steps (b) and (c), said step (b) has the steps of:

(b-1) forming a first film containing said first impurity on said first main surface; and (b-2) diffusing said first impurity into said substrate from said first film, and said step (c) has the steps of:

(c-1) forming a second film containing said second impurity on said second main surface to cover said second oxide film; and (c-2) diffusing said second impurity into said substrate from said second film.

19. A method of manufacturing a semiconductor device, comprising the steps of:

(a) preparing a substrate of a first conductivity type, having a first main surface and a second main surface which are opposed to each other;

(b) forming an impurity diffusion layer of a second conductivity type different from said first conductivity type by diffusing a first impurity into said substrate from said first main surface; and (c) forming an impurity diffusion region of said second conductivity type by diffusing a second impurity into said substrate from part of said second main surface, to have a bottom surface reaching said impurity diffusion layer and surround a portion of said substrate which has said first conductivity type in a plan view, wherein said portion surrounded by said impurity diffusion region is defined as an element formation region, the method further comprising:

(d) forming a first impurity region of said second conductivity type partially in said second main surface in said element formation region;

(e) forming a second impurity region of said first conductivity type partially in said second main surface in said first impurity region; and (f) forming a gate electrode on said second main surface with a gate insulating film interposed therebetween above said first impurity region positioned between said second impurity region and a portion of said substrate which has said first conductivity type, wherein said first impurity region serves as a base of a transistor, said second impurity region serves as an emitter of said transistor, and said impurity diffusion layer serves as a collector of said transistor.

20. The method according to claim 19, further comprising the steps of:

(g) forming a first main electrode formed on said first main surface to be into contact with said impurity diffusion layer; and (h) forming a second main electrode formed on said second main surface to be into contact with said first and second impurity regions.

21. The method according to claim 20, further comprising the step of:

(i) thinning said impurity diffusion layer by polishing said substrate from the side of said first main surface only by a predetermined film thickness, wherein said step (i) is executed before said step (g).

22. The method according to claim 21, further comprising the step of:

(j) forming a local lifetime region by implanting an impurity into said portion of said substrate which has said first conductivity type from said side of said first main surface through said impurity diffusion layer, wherein said step (j) is executed after said step (i).

23. The method according to claim 19, further comprising the step of:

(k) forming a first local lifetime region by implanting proton into a substantially middle region, with respect to a film thickness direction, of said portion of said substrate which has said first conductivity type, from said first main surface through said impurity diffusion layer.

24. The method according to claim 23, further comprising the step of:

(l) forming a second local lifetime region by implanting helium into a deep region of said portion of said substrate which has said first conductivity type, said deep region being nearer to said impurity diffusion layer than said first local lifetime region.

25. A method of manufacturing a semiconductor device, comprising the steps of:

(a) preparing a substrate of a first conductivity type, having a first main surface and a second main surface which are opposed to each other;

(b) forming, in said first main surface, an impurity diffusion layer of a second conductivity type different from said first conductivity type, said impurity diffusion layer serving as a collector of a transistor; and (c) forming, partially in said second main surface, an impurity diffusion region of said second conductivity type having a bottom surface reaching said impurity diffusion layer and surrounding a portion of said substrate which has said first conductivity type in a plan view, wherein said portion surrounded by said impurity diffusion region is defined as an element formation region, the method further comprising:

(d) forming, partially in said second main surface in said element formation region, a first impurity region of said second conductivity type serving as a base of said transistor;

(e) forming, partially in said second main surface in said first impurity region, a second impurity region of said first conductivity type serving as an emitter of said transistor;

(f) forming a gate electrode on said second main surface with a gate insulating film interposed therebetween above said first impurity region positioned between said second impurity region and a portion of said substrate which has said first conductivity type; and (g) forming a first local lifetime region by implanting proton into a substantially middle region, with respect to a film thickness direction, of said portion of said substrate which has said first conductivity type, from said first main surface through said impurity diffusion layer.

26. The method according to claim 25, further comprising the step of:

(h) forming a second local lifetime region by implanting helium into a deep region of said portion of said substrate which has said first conductivity type, said deep region being nearer to said impurity diffusion layer than said first local lifetime region.

* * * * *